(12) United States Patent
Sasaki et al.

(10) Patent No.: US 8,426,979 B2
(45) Date of Patent: Apr. 23, 2013

(54) COMPOSITE LAYERED CHIP PACKAGE

(75) Inventors: Yoshitaka Sasaki, Santa Clara, CA (US); Hiroyuki Ito, Milpitas, CA (US); Hiroshi Ikejima, Hong Kong (CN); Atsushi Iijima, Hong Kong (CN)

(73) Assignees: Headway Technologies, Inc., Milpitas, CA (US); SAE Magnetics (H.K.) Ltd., Hong Kong (CN)

( * ) Notice: Subject to any disclaimer, the term of this patent is extended or adjusted under 35 U.S.C. 154(b) by 58 days.

(21) Appl. No.: 13/184,971

(22) Filed: Jul. 18, 2011

(65) Prior Publication Data

US 2013/0020723 A1    Jan. 24, 2013

(51) Int. Cl.
    *H01L 23/52*    (2006.01)
(52) U.S. Cl.
    USPC ........... 257/777; 257/686; 257/E23.169; 257/E25.006; 257/E25.11; 257/E25.013; 257/E25.025; 257/E25.027
(58) Field of Classification Search ............ 257/686, 257/777, E23.169, E25.006, E25.011, E25.013, 257/E25.025, E25.027
    See application file for complete search history.

(56) References Cited

U.S. PATENT DOCUMENTS

| 5,953,588 | A  | 9/1999  | Camien et al.    |
| 7,127,807 | B2 | 10/2006 | Yamaguchi et al. |
| 7,902,677 | B1 | 3/2011  | Sasaki et al.    |
| 2007/0165461 | A1 | 7/2007 | Cornwell et al.  |

OTHER PUBLICATIONS

Gann, Keith D., "Neo-Stacking Technology," *HDI Magazine*, Dec. 1999.

*Primary Examiner* — Peniel M Gumedzoe
(74) *Attorney, Agent, or Firm* — Oliff & Berridge, PLC

(57) ABSTRACT

A composite layered chip package includes a plurality of subpackages stacked on each other. Each subpackage includes a main body and wiring. The main body includes a main part including a plurality of layer portions, and further includes first terminals and second terminals that are disposed on top and bottom surfaces of the main part, respectively. The wiring is electrically connected to the first and second terminals. The number of the plurality of layer portions included in the main part is the same for all the plurality of subpackages, and the plurality of layer portions in every subpackage include at least one first-type layer portion. In each of at least two of the subpackages, the plurality of layer portions further include at least one second-type layer portion. The first-type layer portion includes a semiconductor chip connected to the wiring, whereas the second-type layer portion includes a semiconductor chip not connected to the wiring.

8 Claims, 24 Drawing Sheets

COMPOSITE LAYERED CHIP PACKAGE

BACKGROUND OF THE INVENTION

1. Field of the Invention

The present invention relates to a composite layered chip package that includes a plurality of subpackages stacked on each other.

2. Description of the Related Art

In recent years, lighter weight and higher performance have been demanded of portable devices typified by cellular phones and notebook personal computers. Accordingly, there has been a need for higher integration of electronic components for use in the portable devices. With the development of image- and video-related equipment such as digital cameras and video recorders, semiconductor memories of larger capacity and higher integration have also been demanded.

As an example of highly integrated electronic components, a system-in-package (hereinafter referred to as SiP), especially an SiP utilizing a three-dimensional packaging technology for stacking a plurality of semiconductor chips, has attracting attention in recent years. In the present application, a package that includes a plurality of semiconductor chips (hereinafter, also simply referred to as chips) stacked is called a layered chip package. Since the layered chip package allows a reduction in wiring length, it provides the advantage of allowing quick circuit operation and a reduced stray capacitance of the wiring, as well as the advantage of allowing higher integration.

Major examples of the three-dimensional packaging technology for fabricating a layered chip package include a wire bonding method and a through electrode method. The wire bonding method stacks a plurality of chips on a substrate and connects a plurality of electrodes formed on each chip to external connecting terminals formed on the substrate by wire bonding. The through electrode method forms a plurality of through electrodes in each of chips to be stacked and wires the chips together by using the through electrodes.

The wire bonding method has the problem that it is difficult to reduce the distance between the electrodes so as to avoid contact between the wires, and the problem that the high resistances of the wires hamper quick circuit operation. The through electrode method is free from the above-mentioned problems of the wire bonding method.

U.S. Pat. No. 5,953,588 discloses a method of manufacturing a layered chip package as described below. In the method, a plurality of chips cut out from a processed wafer are embedded into an embedding resin and then a plurality of leads are formed to be connected to each chip, whereby a structure called a neo-wafer is fabricated. Next, the neo-wafer is diced into a plurality of structures each called a neo-chip. Each neo-chip includes one or more chips, resin surrounding the chip(s), and a plurality of leads. The plurality of leads connected to each chip have their respective end faces exposed in a side surface of the neo-chip. Next, a plurality of types of neo-chips are laminated into a stack. In the stack, the respective end faces of the plurality of leads connected to the chips of each layer are exposed in the same side surface of the stack.

Keith D. Gann, "Neo-Stacking Technology", HDI Magazine, December 1999, discloses fabricating a stack by the same method as that disclosed in U.S. Pat. No. 5,953,588, and forming wiring on two side surfaces of the stack.

U.S. Pat. No. 7,127,807 B2 discloses a multilayer module formed by stacking a plurality of active layers each including a flexible polymer substrate with at least one electronic element and a plurality of electrically-conductive traces formed within the substrate. U.S. Pat. No. 7,127,807 B2 further discloses a manufacturing method for a multilayer module as described below. In the manufacturing method, a module array stack is fabricated by stacking a plurality of module arrays each of which includes a plurality of multilayer modules arranged in two orthogonal directions. The module array stack is then cut into a module stack which is a stack of a plurality of multilayer modules. Next, a plurality of electrically-conductive lines are formed on the respective side surfaces of the plurality of multilayer modules included in the module stack. The module stack is then separated from each other into individual multilayer modules.

The yield of chips from a wafer that is to be cut later into a plurality of chips, i.e., the ratio of the number of conforming chips to the total number of chips in the wafer, is generally 90% to 99%. A layered chip package includes a plurality of chips. Therefore, the possibility that all the chips included in a layered chip package are conforming is lower than the yield of the chips. As the number of chips included in a layered chip package increases, the possibility that all the chips included in the layered chip package are conforming decreases.

A case will now be considered where a memory device such as a flash memory is constructed using a layered chip package. Generally, in a memory device such as a flash memory, a redundancy technique to replace a defective column of memory cells with a redundant column of memory cells is used so that the memory device can operate normally even when some memory cells are defective. Also in a memory device constructed using a layered chip package, if some of a plurality of memory cells included in a chip are defective, the redundancy technique can be used to allow the memory device to operate normally while allowing the use of the chip including the defective memory cells. Suppose, however, that a chip including a control circuit and a plurality of memory cells becomes defective due to, for example, a wiring failure in the control circuit, and even the redundancy technique cannot allow the chip to operate normally. In such a case, the defective chip is no longer usable. One possible solution to this case is to replace the defective chip with a conforming chip. However, this increases the manufacturing cost of the layered chip package.

U.S. Patent Application Publication No. 2007/0165461 A1 discloses a technique of identifying one or more defective flash memory dies in a flash memory device having a plurality of flash memory dies, and disabling memory access operations to each identified die.

In the case of forming a memory device using a layered chip package, one or more defective chips included in the layered chip package may be identified and disabled in the same way as the technique disclosed in U.S. Patent Application Publication No. 2007/0165461 A1.

However, there may be a case where a memory device having a desired memory capacity can be realized when a predetermined number of chips included in the layered chip package are all conforming. In such a case, simply disabling access to any defective chip included in the layered chip package is not sufficient for realizing the memory device having the desired memory capacity.

U.S. Pat. No. 7,902,677 B2 discloses a technique of constructing a composite layered chip package by stacking a plurality of subpackages. At least one of the subpackages in the composite layered chip package includes a defective chip. This technique makes it possible to provide a composite layered chip package that performs, even if it includes a defective chip, the same functions as those in the case without any defective chip. Such a composite layered chip package, however, has room for improvement in terms of manufacturing cost.

OBJECT AND SUMMARY OF THE INVENTION

It is an object of the present invention to provide a composite layered chip package that makes it possible to realize easily and at low cost a package that includes a plurality of semiconductor chips stacked on each other and that performs, even if one or more of the semiconductor chips are malfunctioning, the same functions as those in the case without any malfunctioning semiconductor chip.

A composite layered chip package of the present invention includes a plurality of subpackages stacked on each other, every vertically adjacent two of the plurality of subpackages being electrically connected to each other. Each of the plurality of subpackages includes a main body and wiring. The main body includes: a main part that has a top surface and a bottom surface, and includes a plurality of layer portions stacked on each other; a plurality of first terminals disposed on the top surface of the main part; and a plurality of second terminals disposed on the bottom surface of the main part. The wiring is electrically connected to the plurality of first terminals and the plurality of second terminals. In any vertically adjacent two of the plurality of subpackages, the plurality of second terminals of the main body of an upper one of the two subpackages are electrically connected to the plurality of first terminals of the main body of a lower one of the two subpackages.

The number of the plurality of layer portions included in the main part is the same for all the plurality of subpackages, and the plurality of layer portions in every one of the plurality of subpackages include at least one first-type layer portion. In each of at least two of the plurality of subpackages, the plurality of layer portions further include at least one second-type layer portion. Each of the first-type layer portion and the second-type layer portion includes a semiconductor chip. The semiconductor chip of the first-type layer portion is non-malfunctioning, and is electrically connected to the wiring. The semiconductor chip of the second-type layer portion is not electrically connected to the wiring.

In the composite layered chip package of the present invention, each of the first-type layer portion and the second-type layer portion may further include a plurality of electrodes that are electrically connected to the wiring. In this case, the plurality of electrodes of the first-type layer portion may be electrically connected to the semiconductor chip of the first-type layer portion, with the plurality of electrodes of the second-type layer portion not electrically connected to the semiconductor chip of the second-type layer portion.

In the composite layered chip package of the present invention, the semiconductor chip of the first-type layer portion and the semiconductor chip of the second-type layer portion may each include a plurality of memory cells.

In the composite layered chip package of the present invention, the number of the plurality of layer portions included in the main part may be two in every one of the plurality of subpackages. In this case, the number of the plurality of subpackages may be no less than five and no more than eight, and the number of the at least one first-type layer portion included in the composite layered chip package may be eight.

In the composite layered chip package of the present invention, the number of the plurality of layer portions included in the main part may be four in every one of the plurality of subpackages. In this case, the number of the plurality of subpackages may be no less than three and no more than eight, and the number of the at least one first-type layer portion included in the composite layered chip package may be eight.

In the composite layered chip package of the present invention, the number of the plurality of layer portions included in the main part may be eight in every one of the plurality of subpackages. In this case, the number of the plurality of subpackages may be no less than two and no more than eight, and the number of the at least one first-type layer portion included in the composite layered chip package may be eight.

The present invention makes it possible to construct a composite layered chip package that includes a desired number of first-type layer portions by using a plurality of subpackages. In the present invention, the number of the plurality of layer portions included in the main part is the same for all the plurality of subpackages. This makes it possible to reduce the manufacturing cost of the subpackages. Furthermore, at least two of the plurality of subpackages each include at least one second-type layer portion. The semiconductor chip of the second-type layer portion is not electrically connected to the wiring, and may thus be a malfunctioning semiconductor chip. The present invention thus allows the use of a greater number of subpackages that include malfunctioning semiconductor chips. Consequently, according to the present invention, it is possible to realize easily and at low cost a package that includes a plurality of semiconductor chips stacked on each other and that performs, even if one or more of the semiconductor chips are malfunctioning, the same functions as those in the case without any malfunctioning semiconductor chip.

Other and further objects, features and advantages of the present invention will appear more fully from the following description.

DETAILED DESCRIPTION OF THE PREFERRED EMBODIMENTS

First Embodiment

Figure 1:
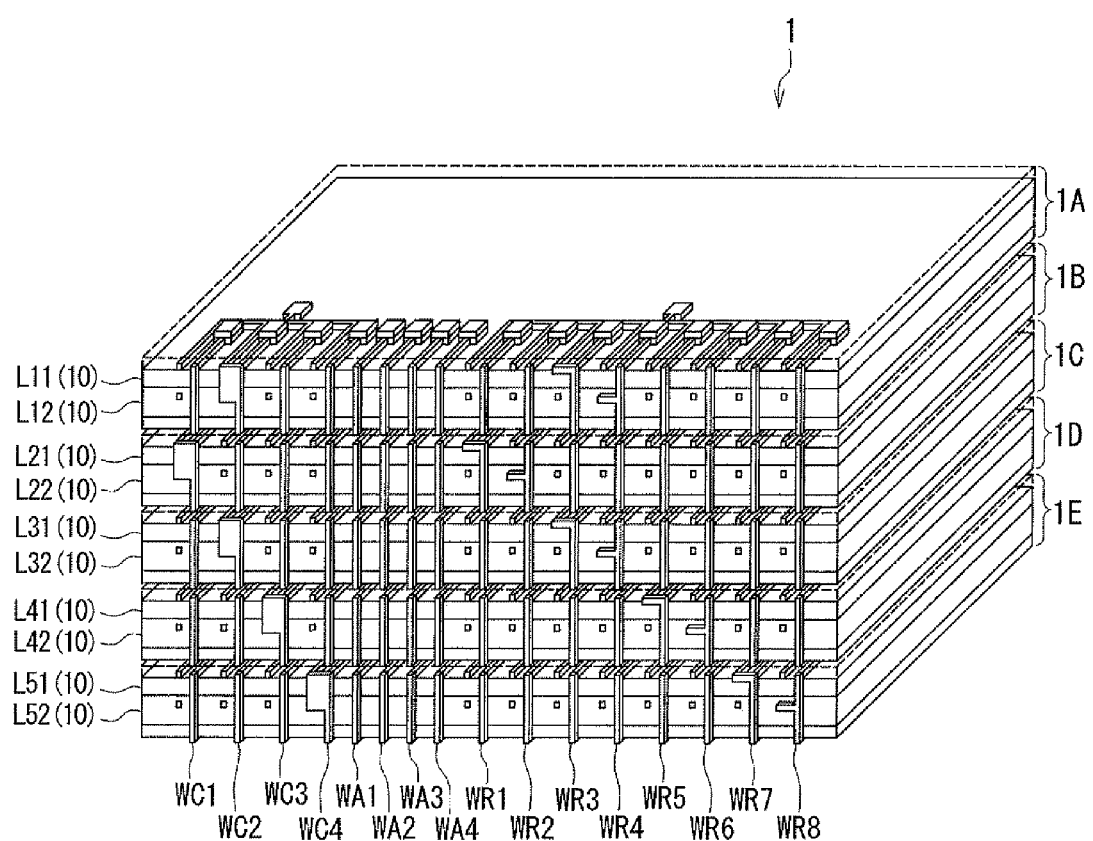
FIG. 1 is a perspective view of a composite layered chip package according to a first embodiment of the invention.
Figure 2:
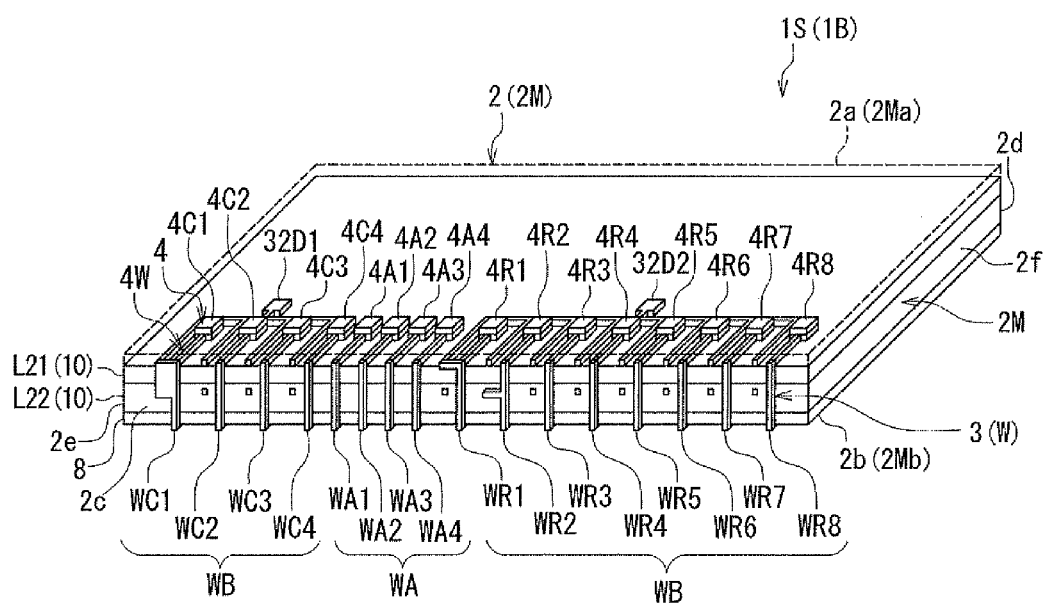
FIG. 2 is a perspective view of a subpackage of the first embodiment of the invention.
Figure 3:
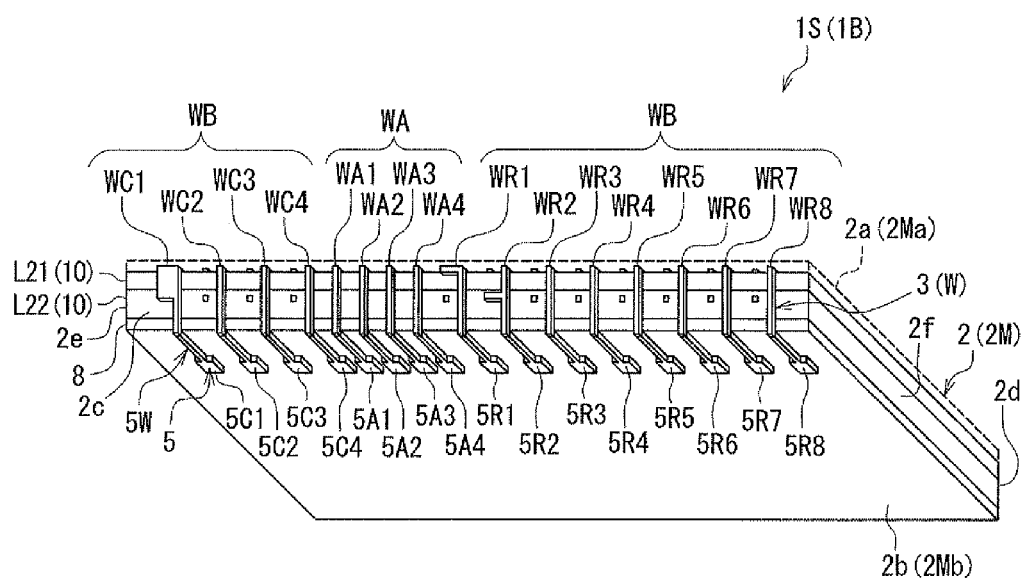
FIG. 3 is a perspective view showing the subpackage of FIG. 2 as viewed from below.
Figure 4:
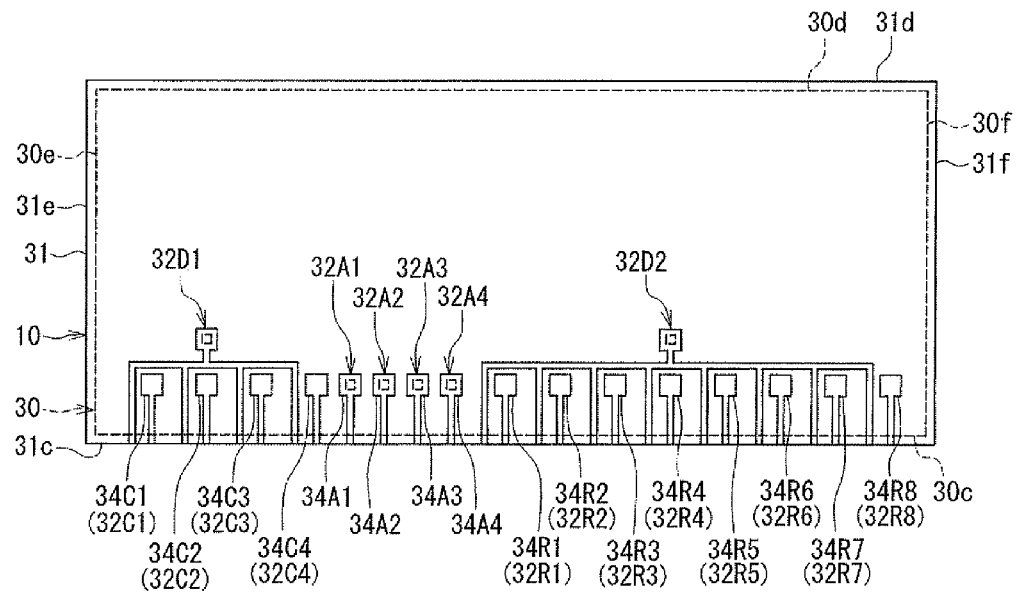
FIG. 4 is a plan view showing a layer portion included in the subpackage of FIG. 2.
Figure 5:
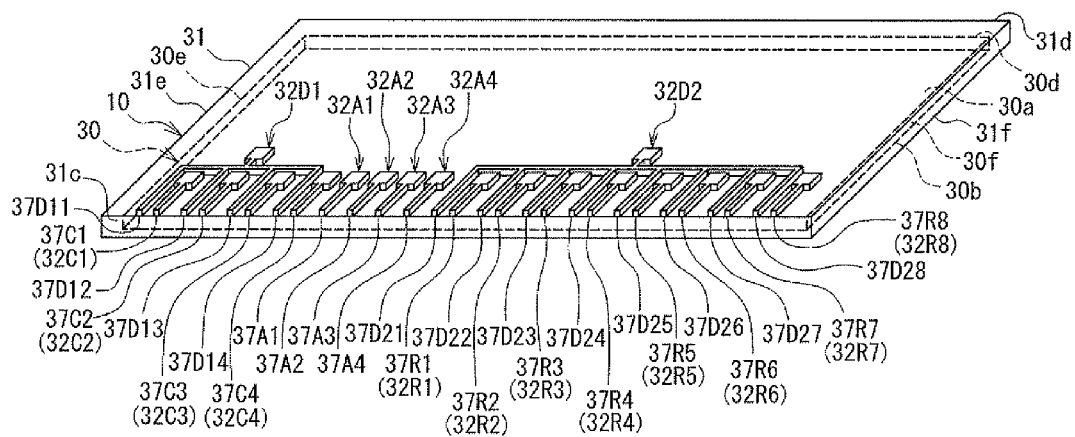
FIG. 5 is a perspective view of the layer portion shown in FIG. 4.

Preferred embodiments of the present invention will now be described in detail with reference to the drawings. First, reference is made to FIG. 1 to FIG. 5 to describe the configuration of a composite layered chip package according to a first embodiment of the invention. FIG. 1 is a perspective view of the composite layered chip package according to the present embodiment. FIG. 2 is a perspective view of a subpackage of the present embodiment. FIG. 3 is a perspective view showing the subpackage of FIG. 2 as viewed from below. FIG. 4 is a plan view showing a layer portion included in the subpackage of FIG. 2. FIG. 5 is a perspective view of the layer portion shown in FIG. 4.

As shown in FIG. 1, the composite layered chip package 1 according to the present embodiment includes a plurality of subpackages stacked on each other, every vertically adjacent two of the plurality of subpackages being electrically connected to each other. FIG. 1 shows an example where the composite layered chip package 1 includes five subpackages 1A, 1B, 1C, 1D, and 1E that are arranged in order from the top. Note that the subpackages 1A to 1E may be stacked in any order other than the example shown in FIG. 1. Any subpackage will hereinafter be represented by the symbol 1S.

As shown in FIG. 2 and FIG. 3, each subpackage 1S includes a main body 2 and wiring 3. The wiring 3 includes a plurality of wires W disposed on at least one of side surfaces of the main body 2. The main body 2 has a top surface 2a, a bottom surface 2b, and first to fourth side surfaces 2c, 2d, 2e, and 2f. The side surfaces 2c and 2d are mutually opposite to each other. The side surfaces 2e and 2f are mutually opposite to each other. In the example shown in FIG. 2 and FIG. 3, the plurality of wires W are disposed on the first side surface 2c only. The main body 2 includes a main part 2M. The main part 2M has a top surface 2Ma and a bottom surface 2Mb, and includes a plurality of layer portions 10 stacked on each other. The plurality of wires W pass through all the plurality of layer portions 10.

The main body 2 further includes a plurality of first terminals 4 and a plurality of second terminals 5. The plurality of first terminals 4 are disposed on the top surface 2Ma of the main part 2M and electrically connected to the plurality of wires W. The plurality of second terminals 5 are disposed on the bottom surface 2Mb of the main part 2M and electrically connected to the plurality of wires W. The main body 2 further includes top wiring 4W and bottom wiring 5W. The top wiring 4W is disposed on the top surface 2Ma of the main part 2M and electrically connects the plurality of first terminals 4 to the plurality of wires W. The bottom wiring 5W is disposed on the bottom surface 2Mb of the main part 2M and electrically connects the plurality of second terminals 5 to the plurality of wires W.

The plurality of second terminals 5 are positioned to overlap the plurality of first terminals 4 as viewed in a direction perpendicular to the top surface 2a of the main body 2. The plurality of second terminals 5 of an upper one of two vertically adjacent subpackages 1S are therefore opposed to the plurality of first terminals 4 of a lower one of the two subpackages 1S. In any two vertically adjacent subpackages 1S, the plurality of second terminals 5 of the upper subpackage 1S are electrically connected to the plurality of first terminals 4 of the lower subpackage 1S.

At least either the terminals 4 or the terminals 5 may each include a solder layer made of a solder material, the solder layer being exposed in the surface of each of the terminals 4 or each of the terminals 5. In such a case, the solder layer is heated to melt and then solidified, whereby the plurality of second terminals 5 of the upper one of two vertically adjacent subpackages 1S are electrically connected to the plurality of first terminals 4 of the lower one.

The plurality of layer portions 10 are stacked between the top surface 2Ma and the bottom surface 2Mb of the main part 2M. Every two vertically adjacent layer portions 10 are bonded to each other with an adhesive, for example. As one example, FIG. 1 to FIG. 3 show a case where the main part 2M includes two layer portions 10. However, the number of the layer portions 10 included in the main part 2M is not limited to two, and may be any number more than one. It should be noted that the number of the plurality of layer portions 10 included in the main part 2M is the same for all the plurality of subpackages 1S. Hereinafter, the plurality of layer portions 10 in the subpackages 1A to 1E shown in FIG. 1 will be represented by the reference symbols L11, L12, L21, L22, L31, L32, L41, L42, L51, and L52 in order from the top when those layer portions are to be distinguished from each other. The upper layer portions L11, L21, L31, L41, and L51 in the respective main parts 2M will also be referred to as first layer portions. The lower layer portions L12, L22, L32, L42, and L52 in the respective main parts 2M will also be referred to as second layer portions.

The main part 2M of the main body 2 further includes an insulating layer 8 bonded to the bottom surface of the second layer portion L12 to L52 located lowermost in the main body 2M. The bottom surface 2Mb of the main part 2M is composed of the bottom surface of the insulating layer 8. The main part 2M may further include another insulating layer located on the bottom surface 2Mb of the main part 2M and covering the bottom wiring 5W.

A description will now be given of the layer portions 10 with reference to FIG. 4 and FIG. 5. Each of the layer portions 10 includes a semiconductor chip 30. The semiconductor chip 30 has: a first surface 30a with a device formed thereon; a second surface 30b opposite to the first surface 30a; a first side surface 30c and a second side surface 30d that are mutually opposite to each other; and a third side surface 30e and a fourth side surface 30f that are mutually opposite to each other. The side surfaces 30c, 30d, 30e, and 30f face toward the side surfaces 2c, 2d, 2e, and 2f of the main body 2, respectively.

Each of the layer portions 10 further includes an insulating portion 31 and a plurality of electrodes. The insulating portion 31 covers at least one of the four side surfaces of the semiconductor chip 30. The insulating portion 31 has at least one end face that is located in the at least one of the side surfaces of the main body 2 on which the plurality of wires W are disposed. In the example shown in FIG. 4 and FIG. 5, the insulating portion 31 covers all of the four side surfaces 30c, 30d, 30e and 30f of the semiconductor chip 30, and has four end faces 31c, 31d, 31e and 31f located in the four side surfaces of the main body 2. The four end faces 31c, 31d, 31e, and 31f of the insulating portion 31 lie outside the four side surfaces 30c, 30d, 30e, and 30f of the semiconductor chip 30, respectively. The plurality of electrodes are disposed on the side of the first surface 30a of the semiconductor chip 30.

A detailed description will now be given of the plurality of terminals 4 and 5, the plurality of wires W, and the plurality of electrodes of the present embodiment. In the present embodiment, the plurality of second terminals 5 are electrically connected to corresponding ones of the first terminals 4 via the wires W to form a plurality of pairs of first and second terminals 4 and 5. In each of the plurality of pairs of first and second terminals 4 and 5, the first and second terminals 4 and 5 are electrically connected to each other. Each of the plurality of pairs of first and second terminals 4 and 5 consists of any one of the first terminals 4 and any one of the second terminals 5 that are electrically connected to each other and are positioned to overlap each other as viewed in the direction perpendicular to the top surface 2a of the main body 2.

In the example shown in FIG. 2 and FIG. 3, the plurality of first terminals 4 include first-type terminals 4A1, 4A2, 4A3, and 4A4, second-type terminals 4C1, 4C2, 4C3, and 4C4, and third-type terminals 4R1, 4R2, 4R3, 4R4, 4R5, 4R6, 4R7, and 4R8. Likewise, the plurality of second terminals 5 include first-type terminals 5A1, 5A2, 5A3, and 5A4, second-type terminals 5O1, 5C2, 5C3, and 5C4, and third-type terminals 5R1, 5R2, 5R3, 5R4, 5R5, 5R6, 5R7, and 5R8. The terminals 5A1 to 5A4 are paired with the terminals 4A1 to 4A4, respectively. The terminals 5C1 to 5C4 are paired with the terminals 4C1 to 4C4, respectively. The terminals 5R1 to 5R8 are paired with the terminals 4R1 to 4R8, respectively.

The plurality of wires W include a plurality of common wires WA that are used for a purpose common to all the layer portions 10 in the composite layered chip package 1, and a plurality of layer-dependent wires WB that are used by different ones of the plurality of layer portions 10. The plurality of common wires WA include wires WA1, WA2, WA3, and WA4. The plurality of layer-dependent wires WB include wires WC1, WC2, WC3, WC4, WR1, WR2, WR3, WR4, WR5, WR6, WR7, and WR8. The wires WA1, WA2, WA3, and WA4 electrically connect the first and second terminals 4 and 5 in the pairs of terminals (4A1, 5A1), (4A2, 5A2), (4A3, 5A3), and (4A4, 5A4), respectively.

The wires WC1, WC2, WC3, and WC4 electrically connect the first and second terminals 4 and 5 in the pairs of terminals (4C1, 5C1), (4C2, 5C2), (4C3, 5C3), and (4C4, 5C4), respectively.

The wires WR1, WR2, WR3, WR4, WR5, WR6, WR7, and WR8 electrically connect the first and second terminals 4 and 5 in the pairs of terminals (4R1, 5R1), (4R2, 5R2), (4R3, 5R3), (4R4, 5R4), (4R5, 5R5), (4R6, 5R6), (4R7, 5R7), and (4R8, 5R8), respectively.

As will be described in detail later, the plurality of first terminals 4 are formed by using the plurality of electrodes of a layer portion L10 (each of the first layer portions L11 to L51) that is located closest to the top surface 2Ma of the main part 2M. The plurality of electrodes include a plurality of terminal component parts that are used to form the plurality of first terminals 4 in the first layer portions L11 to L51. As shown in FIG. 4 and FIG. 5, the plurality of electrodes include the following first- to fourth-type electrodes.

The first-type electrodes 32A1, 32A2, 32A3, and 32A4 respectively include terminal component parts 34A1, 34A2, 34A3, and 34A4 that are used to form the terminals 4A1, 4A2, 4A3, and 4A4 in the first layer portions L11 to L51.

The electrodes 32A1, 32A2, 32A3, and 32A4 further include connection parts 37A1, 37A2, 37A3, and 37A4, respectively. The connection parts 37A1 to 37A4 are formed of respective end faces of the electrodes 32A1 to 32A4 that are located in the end face 31c of the insulating portion 31. The connection parts 37A1 to 37A4 are located in the first side surface 2c of the main body 2 and are in contact with the wires WA1 to WA4, respectively. The electrodes 32A1 to 32A4 are thereby electrically connected to the wires WA1 to WA4, respectively. In at least one of the plurality of layer portions 10 included in the main part 2M, the first-type electrodes 32A1 to 32A4 are in contact with and electrically connected to the semiconductor chip 30. In FIG. 4, the dashed squares in the electrodes 32A1 to 32A4 represent the areas where the electrodes 32A1 to 32A4 make contact with the semiconductor chip 30.

The second-type electrodes 32C1, 32C2, 32C3, and 32C4 respectively include terminal component parts 34C1, 34C2, 34C3, and 34C4 that are used to form the terminals 4C1, 4C2, 4C3, and 4C4 in the first layer portions L11 to L51. The electrodes 32C1, 32C2, 32C3, and 32C4 further include connection parts 37C1, 37C2, 37C3, and 37C4, respectively. The connection parts 37C1 to 37C4 are formed of respective end faces of the electrodes 32C1 to 32C4 that are located in the end face 31c of the insulating portion 31. The connection parts 37C1 to 37C4 are located in the first side surface 2c of the main body 2 and are in contact with the wires WC1 to WC4, respectively. The electrodes 32C1 to 32C4 are thereby electrically connected to the wires WC1 to WC4, respectively. The second-type electrodes are not in contact with the semiconductor chip 30.

The third-type electrodes 32R1, 32R2, 32R3, 32R4, 32R5, 32R6, 32R7, and 32R8 respectively include terminal component parts 34R1, 34R2, 34R3, 34R4, 34R5, 34R6, 34R7, and 34R8 that are used to form the terminals 4R1, 4R2, 4R3, 4R4, 4R5, 4R6, 4R7, and 4R8 in the first layer portions L11 to L51. The electrodes 32R1, 32R2, 32R3, 32R4, 32R5, 32R6, 32R7, and 32R8 further include connection parts 37R1, 37R2, 37R3, 37R4, 37R5, 37R6, 37R7, and 37R8, respectively. The connection parts 37R1 to 37R8 are formed of respective end faces of the electrodes 32R1 to 32R8 that are located in the end face 31c of the insulating portion 31. The connection parts 37R1 to 37R8 are located in the first side surface 2c of the main body 2 and are in contact with the wires WR1 to WR8, respectively. The electrodes 32R1 to 32R8 are thereby electrically connected to the wires WR1 to WR8, respectively. The third-type electrodes are not in contact with the semiconductor chip 30.

The fourth-type electrodes 32D1 and 32D2 are not used to form the terminals 4. The electrode 32D1 has first to fourth branch portions. The first to fourth branch portions of the electrode 32D1 have connection parts 37D11, 37D12, 37D13, and 37D14, respectively. The connection parts 37D11 to 37D14 are formed of respective end faces of the first to fourth branch portions of the electrode 32D1 that are located in the end face 31c of the insulating portion 31. The connection parts 37D11 to 37D14 are located near the connection parts 37C1 to 37C4 of the electrodes 32C1 to 32C4, respectively. The connection parts 37D11 to 37D14 are each located in the first side surface 2c of the main body 2.

The electrode 32D2 has first to eighth branch portions. The first to eighth branch portions of the electrode 32D2 have connection parts 37D21, 37D22, 37D23, 37D24, 37D25, 37D26, 37D27, and 37D28, respectively. The connection parts 37D21 to 37D28 are formed of respective end faces of the first to eighth branch portions of the electrode 32D2 that are located in the end face 31c of the insulating portion 31. The connection parts 37D21 to 37D28 are located near the connection parts 37R1 to 37R8 of the electrodes 32R1 to 32R8, respectively. The connection parts 37D21 to 37D28 are each located in the first side surface 2c of the main body 2.

In at least one of the plurality of layer portions 10 included in the main part 2M, the fourth-type electrodes 32D1 and 32D2 are in contact with and electrically connected to the semiconductor chip 30. In FIG. 4, the dashed squares in the electrodes 32D1 and 32D2 represent the areas where the electrodes 32D1 and 32D2 make contact with the semiconductor chip 30. The first-type electrodes 32A1 to 32A4 and the fourth-type electrodes 32D1 and 32D2 are used for electrical connection to the semiconductor chip 30.

As described below, the fourth-type electrodes 32D1 and 32D2 in each layer portion 10 are selectively electrically connected to one of the wires WC1 to WC4 and one of the wires WR1 and WR8, respectively, that the layer portion 10 uses.

In the example shown in FIG. 1, the wires W in the subpackage 1A are of the same shape as those in the subpackage 1C. The electrical connection relationship of the electrodes 32D1 and 32D2 with the wires W in the subpackage 1A is thus the same as that in the subpackage 1C. In the subpackages 1A and 1C, the wires WC2, WR3, and WR4 are broadened in part.

In the subpackage 1A, the wire WC2 is in contact with the connection part 37D12 in each of the layer portions L11 and L12. The electrode 32D1 of each of the layer portions L11 and L12 is thereby electrically connected to the wire WC2. The wire WR3 is in contact with the connection part 37D23 in the layer portion L11. The electrode 32D2 of the layer portion L11 is thereby electrically connected to the wire WR3. The wire WR4 is in contact with the connection part 37D24 in the layer portion L12. The electrode 32D2 of the layer portion L12 is thereby electrically connected to the wire WR4.

The foregoing description of the subpackage 1A applies to the subpackage 1C if the layer portions L11 and L12 are replaced with the layer portions L31 and L32.

In the subpackage 1B, the wires WC1, WR1, and WR2 are broadened in part. The wire WC1 is in contact with the connection part 32D11 in each of the layer portions L21 and L22. The electrode 32D1 of each of the layer portions L21 and L22 is thereby electrically connected to the wire WC1. The wire WR1 is in contact with the connection part 37D21 in the layer portion L21. The electrode 32D2 of the layer portion L21 is thereby electrically connected to the wire WR1. The wire WR2 is in contact with the connection part 37D22 in the layer portion L22. The electrode 32D2 of the layer portion L22 is thereby electrically connected to the wire WR2.

In the subpackage 1D, the wires WC3, WR5, and WR6 are broadened in part. The wire WC3 is in contact with the connection part 32D13 in each of the layer portions L41 and L42. The electrode 32D1 of each of the layer portions L41 and L42 is thereby electrically connected to the wire WC3. The wire WR5 is in contact with the connection part 37D25 in the layer portion L41. The electrode 32D2 of the layer portion L41 is thereby electrically connected to the wire WR5. The wire WR6 is in contact with the connection part 37D26 in the layer portion L42. The electrode 32D2 of the layer portion L42 is thereby electrically connected to the wire WR6.

In the subpackage 1E, the wires WC4, WR7, and WR8 are broadened in part. The wire WC4 is in contact with the connection part 32D14 in each of the layer portions L51 and L52. The electrode 32D1 of each of the layer portions L51 and L52 is thereby electrically connected to the wire WC4. The wire WR7 is in contact with the connection part 37D27 in the layer portion L51. The electrode 32D2 of the layer portion L51 is thereby electrically connected to the wire WR7. The wire WR8 is in contact with the connection part 37D28 in the layer portion L52. The electrode 32D2 of the layer portion L52 is thereby electrically connected to the wire WR8.

In each of the first layer portions L11 to L51, the insulating portion 31 does not cover the terminal component parts of the plurality of electrodes but covers the other portions of the plurality of electrodes and the first surface 30a of the semiconductor chip 30. The terminal component parts not covered by the insulating portion 31 form conductor pads. Conductor layers are formed on the conductor pads. The terminal component parts and the conductor layers in each of the first layer portions L11 to L51 constitute the first terminals 4. In the present embodiment, the plurality of first terminals 4 are thus formed by using the plurality of electrodes (the plurality of terminal component parts) of each of the first layer portions L11 to L51. Part of the portions of the plurality of electrodes covered by the insulating portion 31 in each of the first layer portions L11 to L51 forms the top wiring 4W. In FIG. 1 to FIG. 3, the insulating portions 31 in the first layer portions L11 to L51 are partly shown in broken lines.

The number of the plurality of layer portions 10 included in the main part 2M is the same for all the plurality of subpackages 1S constituting the composite layered chip package 1, and the plurality of layer portions 10 in every one of the plurality of subpackages 1S include at least one first-type layer portion. In each of at least two of the plurality of subpackages 1S, the plurality of layer portions 10 further include at least one second-type layer portion. In the present embodiment, the number of the plurality of layer portions 10 included in the main part 2M is two in every one of the plurality of subpackages 1S. Consequently, when the plurality of layer portions 10 include a second-type layer portion, the plurality of layer portions 10 consist of one first-type layer portion and one second-type layer portion.

Each of the first-type layer portion and the second-type layer portion includes a semiconductor chip 30. The semiconductor chip 30 of the first-type layer portion is non-malfunctioning, and is electrically connected to the wiring 3. The semiconductor chip 30 of the second-type layer portion is not electrically connected to the wiring 3. The semiconductor chip 30 of the second-type layer portion may be non-malfunctioning or malfunctioning. Hereinafter, a non-malfunctioning semiconductor chip 30 will be referred to as a conforming semiconductor chip 30, and a malfunctioning semiconductor chip 30 will be referred to as a defective semiconductor chip 30. Hereinafter, the first-type layer portion will be represented by the reference symbol 10A and the second-type layer portion will be represented by the reference symbol 10B when the first-type layer portion and the second-type layer portion are to be distinguished from each other.

In the first-type layer portion 10A, the first-type electrodes 32A1 to 32A4 are in contact with and electrically connected to the semiconductor chip 30. In the second-type layer portion 10B, none of the first-type electrodes 32A1 to 32A4 are in contact with the semiconductor chip 30. Therefore, in the second-type layer portion 10B, none of the first-type electrodes 32A1 to 32A4 are electrically connected to the semiconductor chip 30.

In the first-type layer portion 10A, the fourth-type electrodes 32D1 and 32D2 are electrically connected to the semiconductor chip 30, and the semiconductor chip 30 is thereby electrically connected to two layer-dependent wires WB to which the electrodes 32D1 and 32D2 are electrically connected, i.e., one of the wires WC1 to WC4 to which the electrode 32D1 is electrically connected and one of the wires WR1 to WR8 to which the electrode 32D2 is electrically connected. In the second-type layer portion 10B, neither of the electrodes 32D1 and 32D2 is electrically connected to the semiconductor chip 30, and the semiconductor chip 30 is therefore not electrically connected to the two layer-dependent wires WB to which the electrodes 32D1 and 32D2 are electrically connected.

The semiconductor chip 30 may be a memory chip that constitutes a memory such as a flash memory, DRAM, SRAM, MRAM, PROM, or FeRAM. In such a case, the semiconductor chip 30 includes a plurality of memory cells. It is possible in this case to construct a memory device of large capacity by using the composite layered chip package 1 including a plurality of semiconductor chips 30. With the composite layered chip package 1 according to the present embodiment, it is also possible to easily construct a memory device of various capacities such as 64 GB (gigabytes), 128 GB, and 256 GB by varying the number of the semiconductor chips 30 to be included in the composite layered chip package 1.

Suppose that the semiconductor chip 30 includes a plurality of memory cells. In this case, even if one or more of the memory cells are defective, the semiconductor chip 30 is still conforming if it can function normally by employing the redundancy technique.

The semiconductor chips 30 are not limited to memory chips, and may be ones used for constructing other devices such as CPUs, sensors, and driving circuits for sensors.

Figure 6:
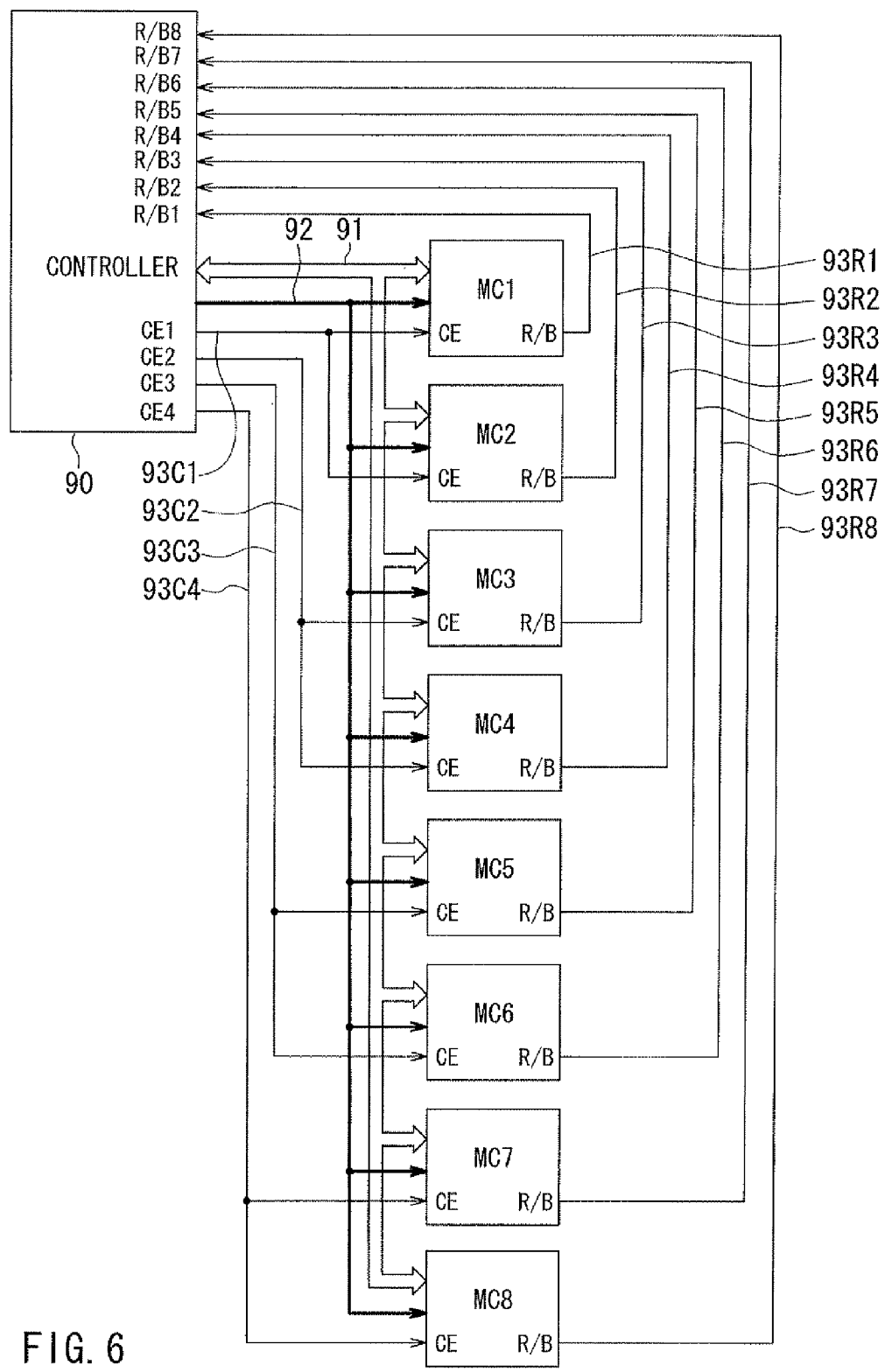
FIG. 6 is a block diagram showing the configuration of a memory device.

The composite layered chip package 1 according to the present embodiment will be described in more detail below with reference to a case where the composite layered chip package 1 is used to construct a memory device. FIG. 6 is a block diagram showing the configuration of the memory device. The memory device includes eight memory chips MC1, MC2, MC3, MC4, MC5, MC6, MC7, and MC8, and a controller 90 which controls these memory chips. Each of the memory chips includes a plurality of memory cells and a peripheral circuit such as an address decoder.

The memory device further includes a data bus 91 which electrically connects the controller 90 to the eight memory chips, and one or more common lines 92 which electrically connect the controller 90 to the eight memory chips. Each of the eight memory chips includes a plurality of electrode pads to which the data bus 91 is electrically connected, and one or more electrode pads to which the one or more common lines 92 are electrically connected. The data bus 91 transmits addresses, commands, data, etc. The one or more common lines 92 include power lines as well as signal lines for transmitting signals that are other than those transmitted by the data bus 91 and are used in common by the eight memory chips.

Each of the eight memory chips further includes an electrode pad CE for receiving a chip enable signal and an electrode pad R/B for outputting a ready/busy signal. The chip enable signal is a signal for controlling whether to select or deselect the memory chip. The ready/busy signal is a signal for indicating the operating state of the memory chip.

The memory device shown in FIG. 6 further includes signal lines 93C1, 93C2, 93C3, and 93C4. The signal line 93C1 electrically connects the controller 90 to the electrode pads CE of the memory chips MC1 and MC2, and transmits a chip enable signal CE1. The signal line 93C2 electrically connects the controller 90 to the electrode pads CE of the memory chips MC3 and MC4, and transmits a chip enable signal CE2. The signal line 93C3 electrically connects the controller 90 to the electrode pads CE of the memory chips MC5 and MC6, and transmits a chip enable signal CE3. The signal line 93C4 electrically connects the controller 90 to the electrode pads CE of the memory chips MC7 and MC8, and transmits a chip enable signal CE4. Thus, in the example shown in FIG. 6, the signal line 93C1 is used by the memory chips MC1 and MC2 in common, the signal line 93C2 is used by the memory chips MC3 and MC4 in common, the signal line 93C3 is used by the memory chips MC5 and MC6 in common, and the signal line 93C4 is used by the memory chips MC7 and MC8 in common. Nevertheless, eight signal lines for transmitting respective different chip enable signals to the memory chips may be provided instead of the signal lines 93C1, 93C2, 93C3, and 93C4.

The memory device shown in FIG. 6 further includes signal lines 93R1, 93R2, 93R3, 93R4, 93R5, 93R6, 93R7, and 93R8. One end of each of the signal lines 93R1 to 93R8 is electrically connected to the controller 90. The other ends of the signal lines 93R1 to 93R8 are electrically connected to the electrode pads RB of the memory chips MC1 to MC8, respectively. The signal lines 93R1 to 93R8 transmit ready/busy signals R/B1 to RB8, respectively.

If each of the subpackages 1B to 1E includes no second-type layer portion 10B, the memory device shown in FIG. 6 can be constructed by using the subpackages 1B to 1E. Hereinafter, a composite layered chip package constructed by using the subpackages 1B to 1E that are assumed to include no second-type layer portion 10B will be referred to as an imaginary composite layered chip package. The semiconductor chips 30 of the eight layer portions L21, L22, L31, L32, L41, L42, L51, and L52 in the imaginary composite layered chip package function as the memory chips MC1 to MC8 shown in FIG. 6, respectively.

In the present embodiment, the composite layered chip package 1 having the same functions as those of the imaginary composite layered chip package is constructed under the following first to fifth conditions.

The first condition is that the number of the plurality of layer portions 10 included in the main part 2M is the same for all the plurality of subpackages 1S constituting the composite layered chip package 1, and the plurality of layer portions 10 in every one of the plurality of subpackages 1S include at least one first-type layer portion 10A. In the present embodiment, the number of the plurality of layer portions 10 included in the main part 2M is two, in particular.

The second condition is that, in each of at least two of the plurality of subpackages 1S constituting the composite layered chip package 1, the plurality of layer portions 10 further include at least one second-type layer portion 10B. In the present embodiment, since the number of the plurality of layer portions 10 included in the main part 2M is two in particular, the plurality of layer portions 10 in each of at least two of the plurality of subpackages 1S constituting the composite layered chip package 1 include one second-type layer portion 10B.

The third condition is that the number of the first-type layer portions 10A included in the composite layered chip package 1 is eight. The fourth condition is that the number of the plurality of subpackages 1S constituting the composite layered chip package 1 is no less than five and no more than eight. In the present embodiment, the number of the plurality of layer portions 10 included in the main part 2M is two. To satisfy the first to third conditions, the number of the plurality of subpackages 1S constituting the composite layered chip package 1 is therefore inevitably no less than five and no more than eight.

The fifth condition is that the eight first-type layer portions 10A included in the composite layered chip package 1 have the same functions as those of the eight layer portions L21, L22, L31, L32, L41, L42, L51, and L52 of the imaginary composite layered chip package, respectively.

Figure 7:
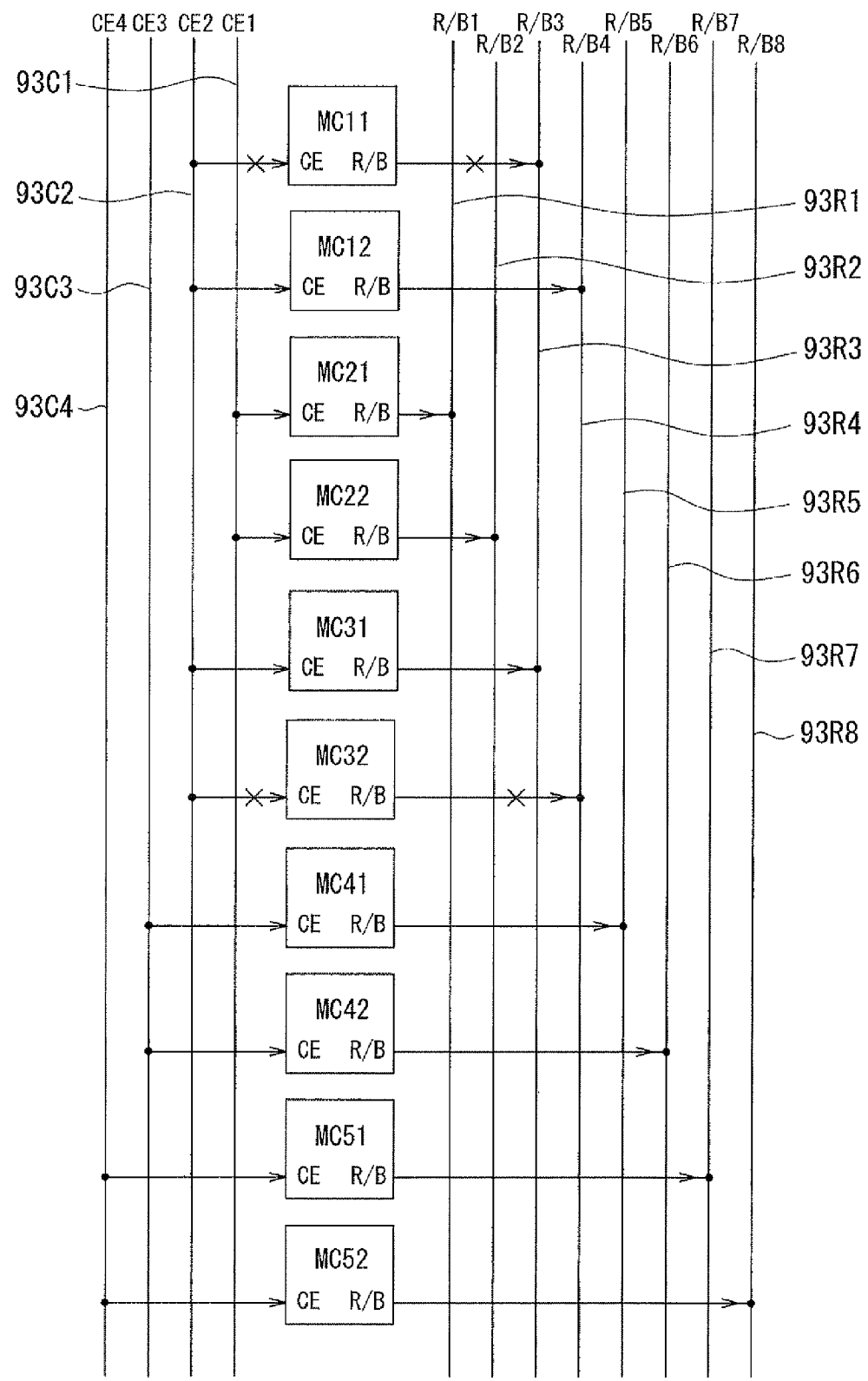
FIG. 7 is a block diagram showing the configuration of a memory device that uses the composite layered chip package according to the first embodiment of the invention.

FIG. 7 is a block diagram showing an example of the configuration of a memory device that uses the composite layered chip package 1 according to the present embodiment. FIG. 7 shows the relationship of a plurality of memory chips with the signal lines 93C1 to 93C4 and 93R1 to 93R8. The memory device shown in FIG. 7 has basically the same configuration as that of the memory device shown in FIG. 6. Although not shown in the drawings, the memory device shown in FIG. 7 includes a controller 90, a data bus 91 and one or more common lines 92, as does the memory device shown in FIG. 6. The controller 90 is provided independent of the composite layered chip package 1, and is electrically connected to the plurality of first terminals 4 of the subpackage 1A or the plurality of second terminals 5 of the subpackage 1E.

The memory device shown in FIG. 7 has memory chips MC11, MC12, MC21, MC22, MC31, MC32, MC41, MC42, MC51, and MC52, instead of the memory chips MC1 to MC8 shown in FIG. 6. The memory chips MC11, MC12, MC21, MC22, MC31, MC32, MC41, MC42, MC51, and MC52 are the semiconductor chips 30 in the layer portions L11, L12, L21, L22, L31, L32, L41, L42, L51, and L52, respectively.

In the composite layered chip package 1 shown in FIG. 1, the plurality of common wires WA (wires WA1 to WA4) constitute portions of the data bus 91 and the one or more common lines 92. The plurality of common wires WA are thus used for a purpose common to all the layer portions 10 in the composite layered chip package 1, i.e., the purpose of transmitting signals and the like that are used in common by all the semiconductor chips 30 (memory chips) in the composite layered chip package 1. The wires WC1, WC2, WC3, and WC4 constitute respective portions of the signal lines 93C1, 93C2, 93C3, and 93C4. The wires WR1, WR2, WR3, WR4, WR5, WR6, WR7, and WR8 constitute respective portions of the signal lines 93R1, 93R2, 93R3, 93R4, 93R5, 93R6, 93R7, and 93R8.

In the example shown in FIG. 1 and FIG. 7, the plurality of layer portions 10 in each of the subpackages 1A and 1C include one second-type layer portion 10B. The subpackages 1A and 1C have the wiring 3 of the same configuration. The subpackages 1A and 1C are complementary. More specifically, the subpackages 1A and 1C are in inverse relationship with each other in terms of the correspondence of the first and second layer portions with the first-type and second-type layer portions 10A and 10B. To put it more concretely, for example, if the subpackage 1C is such that the first layer portion L31 is the first-type layer portion 10A while the second layer portion L32 is the second-type layer portion 10B, then the subpackage 1A is such that the first layer portion L11 is the second-type layer portion 10B while the second layer portion L12 is the first-type layer portion 10A. In such an example, the layer portion L12 of the subpackage 1A substitutes for the layer portion L32 of the subpackage 1C. Consequently, the functions of a single subpackage 1C that is assumed to include no second-type layer portion 10B (such a single subpackage will hereinafter be referred to as an imaginary package) is fulfilled by the two subpackages 1A and 1C. This will be described in more detail below.

In the imaginary package, the electrodes 32D1 and 32D2 of the first layer portion are electrically connected to the wires WC2 and WR3, and the electrodes 32D1 and 32D2 of the second layer portion are electrically connected to the wires WC2 and WR4. The same holds for the subpackages 1A and 1C. It should be noted that in the subpackage 1A, the plurality of electrodes of the first layer portion L11 are not electrically connected to the semiconductor chip 30 (the memory chip MC11). In the subpackage 1C, the plurality of electrodes of the second layer portion L32 are not electrically connected to the semiconductor chip 30 (the memory chip MC32). Such semiconductor chips 30 (memory chips) are thereby disabled.

Since the plurality of electrodes of the first layer portion L31 in the subpackage 1C are electrically connected to the semiconductor chip 30 (the memory chip MC31), the layer portion L31 functions as the first layer portion of the imaginary package. Similarly, since the plurality of electrodes of the second layer portion L12 in the subpackage 1A are electrically connected to the semiconductor chip 30 (the memory chip MC12), the layer portion L12 functions as the second layer portion of the imaginary package. In this way, the functions of a single imaginary package are fulfilled by the two subpackages 1A and 1C.

In the example shown in FIG. 7, the memory chips MC11 and MC32 are thus disabled, and the memory chips MC12, MC21, MC22, MC31, MC41, MC42, MC51, and MC52 are put to use. The memory chips MC12, MC21, MC22, MC31, MC41, MC42, MC51, and MC52 function as the memory chips MC4, MC1, MC2, MC3, MC5, MC6, MC7, and MC8 shown in FIG. 6, respectively. Consequently, the memory device using the composite layered chip package 1 has the same functions as those of a memory device that has the configuration shown in FIG. 6.

The subpackage 1C may be such that the first layer portion L31 is the second-type layer portion 10B while the second layer portion L32 is the first-type layer portion 10A. In such a case, a subpackage 1A whose first layer portion L11 is the first-type layer portion 10A and whose second layer portion L12 is the second-type layer portion 10B is used along with the subpackages 1B to 1E to construct a composite layered chip package 1.

In the foregoing examples, the subpackage 1A is used to compensate for the functions of the subpackage 1C that are lost due to the inclusion of a second-type layer portion 10B. Hereinafter, a subpackage 1S, like the subpackage 1A, that includes a second-type layer portion 10B and is used to compensate for lost functions of another subpackage 1S will be referred to as an additional subpackage 1S.

The configuration of the composite layered chip package 1 according to the present embodiment is not limited to the example shown in FIG. 1 and FIG. 7. For example, the foregoing description of the subpackages 1A and 1C also applies when the plurality of layer portions 10 of any one of the subpackages 1B, 1D, and 1E other than the subpackage 1C include a second-type layer portion 10B. In such a case, an additional subpackage 1S for compensating for the lost functions of the subpackage 1B, 1D, or 1E is used instead of the subpackage 1A. This additional subpackage 1S has the wiring 3 of the same configuration as that of the subpackage 1B, 1D, or 1E. It should be noted that such an additional subpackage 1S is in inverse relationship with the subpackage 1B, 1D, or 1E in terms of the correspondence of the first and second layer portions with the first-type and second-type layer portions 10A and 10B.

If the packages 1B to 1E include two or more subpackages 1S that include a second-type layer portion 10B, the composite layered chip package 1 is constructed by using the subpackages 1B to 1E and as many additional subpackages 1S as the number of subpackages 1S that include a second-type layer portion 10B among the subpackages 1B to 1E. If the number of subpackages 1S including a second-type layer portion 10B among the packages 1B to 1E is two, three, and four, then the number of subpackages 1S to constitute the composite layered chip package 1 is six, seven, and eight, respectively.

The semiconductor chip 30 of the second-type layer portion 10B may be a defective semiconductor chip 30. Consequently, according to the present embodiment, it is possible to provide a composite layered chip package 1 that performs, even if it includes a defective semiconductor chip 30, the same functions as those of an imaginary composite layered chip package which includes no defective semiconductor chip 30.

Figure 8:
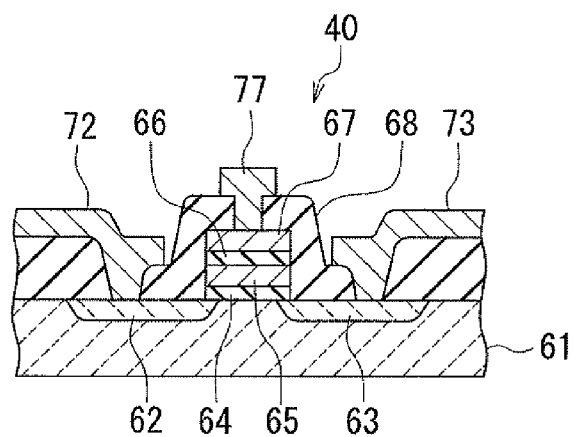
FIG. 8 is a cross-sectional view showing an example of a memory cell included in a semiconductor chip.

Reference is now made to FIG. 8 to describe an example of the configuration of the memory cells included in the semiconductor chip 30 (memory chip). The memory cell 40 shown in FIG. 8 includes a source 62 and a drain 63 formed near a surface of a P-type silicon substrate 61. The source 62 and the drain 63 are both N-type regions. The source 62 and the drain 63 are disposed at a predetermined distance from each other so that a channel composed of a part of the P-type silicon substrate 61 is provided between the source 62 and the drain 63. The memory cell 40 further includes an insulating film 64, a floating gate 65, an insulating film 66, and a control gate 67 that are stacked in this order on the surface of the substrate 61 at the location between the source 62 and the drain 63. The memory cell 40 further includes an insulating layer 68 that covers the source 62, the drain 63, the insulating film 64, the floating gate 65, the insulating film 66 and the control gate 67. The insulating layer 68 has contact holes that open in the tops of the source 62, the drain 63 and the control gate 67, respectively. The memory cell 40 includes a source electrode 72, a drain electrode 73, and a control gate electrode 77 that are formed on the insulating layer 68 at locations above the source 62, the drain 63 and the control gate 67, respectively. The source electrode 72, the drain electrode 73 and the control gate electrode 77 are connected to the source 62, the drain 63 and the control gate 67, respectively, through the corresponding contact holes.

A method of manufacturing the composite layered chip package 1 according to the present embodiment will now be described. The method of manufacturing the composite layered chip package 1 according to the embodiment includes the steps of: fabricating a plurality of subpackages 1S; and stacking the plurality of subpackages 1S on each other and, for any two vertically adjacent subpackages 1S, electrically connecting the plurality of second terminals 5 of the upper subpackage 1S to the plurality of first terminals 4 of the lower subpackage 1S.

The step of fabricating the plurality of subpackages 1S includes, as a series of steps for forming each subpackage 1S, the steps of: fabricating a layered substructure by stacking a plurality of substructures each of which includes a plurality of preliminary layer portions that are arrayed, each of the preliminary layer portions being intended to become any one of the plurality of layer portions 10 included in the main part 2M, the substructures being intended to be cut later at positions of boundaries between every adjacent ones of the preliminary layer portions; and producing a plurality of subpackages 1S from the layered substructure.

Figure 9:
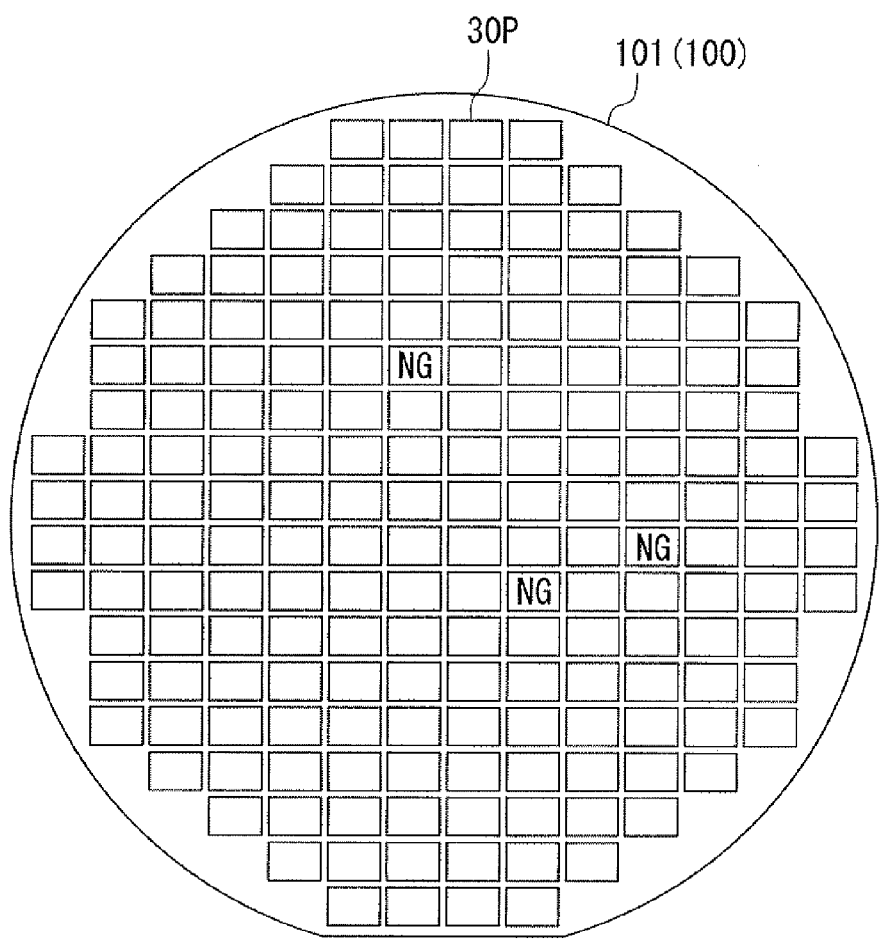
FIG. 9 is a plan view showing a pre-substructure wafer fabricated in a step of a method of manufacturing the composite layered chip package according to the first embodiment of the invention.
Figure 10:
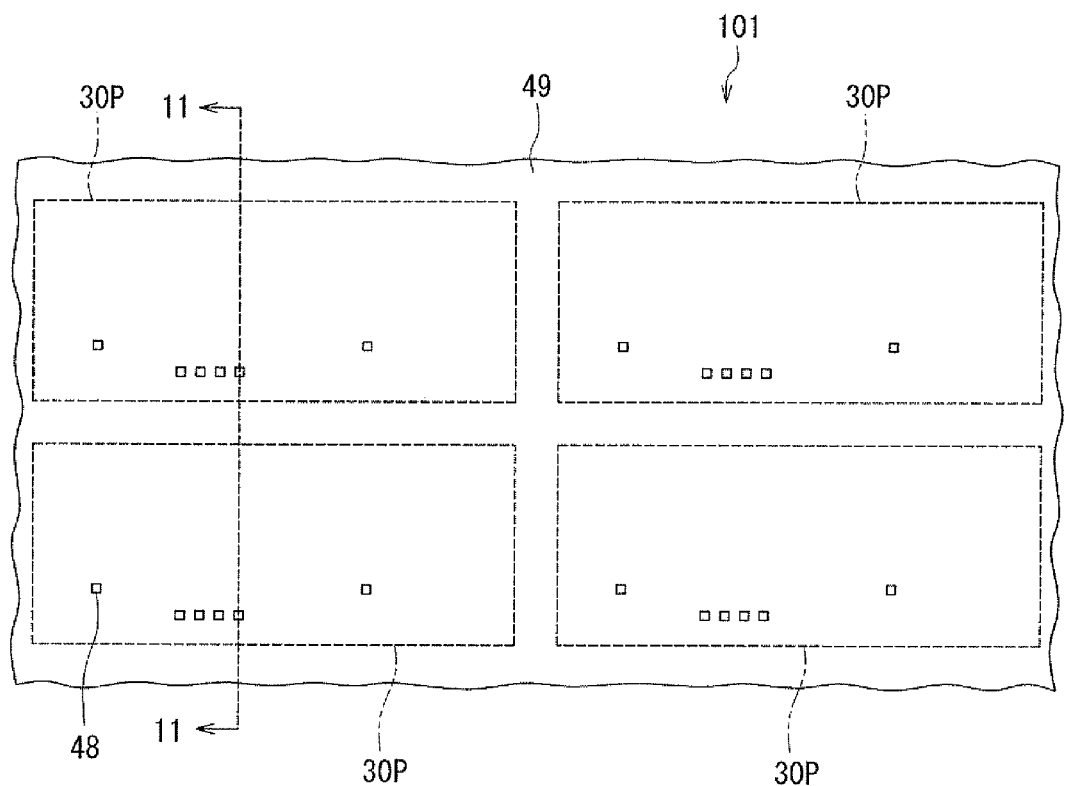
FIG. 10 is a magnified plan view of a part of the pre-substructure wafer shown in FIG. 9.
Figure 11:
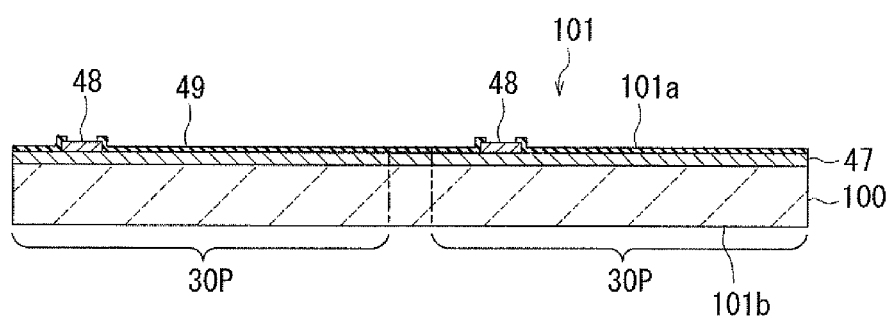
FIG. 11 shows a cross section taken along line 11-11 of FIG. 10.

The step of fabricating the layered substructure will now be described in detail with reference to FIG. 9 to FIG. 22. In the step of fabricating the layered substructure, a pre-substructure wafer 101 is fabricated first. The pre-substructure wafer 101 includes a plurality of pre-semiconductor-chip portions 30P that are arrayed. The pre-semiconductor-chip portions 30P are to become individual semiconductor chips 30. FIG. 9 is a plan view of the pre-substructure wafer 101. FIG. 10 is a magnified plan view of a part of the pre-substructure wafer 101 shown in FIG. 9. FIG. 11 shows a cross section taken along line 11-11 of FIG. 10.

Specifically, in the step of fabricating the pre-substructure wafer 101, the pre-substructure wafer 101 is fabricated by performing processing, such as a wafer process, on one of two mutually opposite surfaces of a semiconductor wafer 100. The plurality of pre-semiconductor-chip portions 30P, each of which includes a device, are arrayed in the pre-substructure wafer 101. In the pre-substructure wafer 101, the plurality of pre-semiconductor-chip portions 30P may be in a row, or in a plurality of rows such that a number of pre-semiconductor-chip portions 30P align both in vertical and horizontal directions. The following description assumes that the plurality of pre-semiconductor-chip portions 30P in the pre-substructure wafer 101 are in a plurality of rows such that a number of pre-semiconductor-chip portions 30P align both in vertical and horizontal directions. The semiconductor wafer 100 may be a silicon wafer, for example. The wafer process is a process in which a semiconductor wafer is processed into a plurality of devices yet to be separated into a plurality of chips. For ease of understanding, FIG. 9 depicts the pre-semiconductor-chip portions 30P larger relative to the semiconductor wafer 100. For example, if the semiconductor wafer 100 is a 12-inch wafer and the top surface of each pre-semiconductor-chip portion 30 is 8 to 10 mm long at each side, then 700 to 900 pre-semiconductor-chip portions 30P are obtainable from a single semiconductor wafer 100.

As shown in FIG. 11, the pre-semiconductor-chip portions 30P include a device-forming region 47 formed near one of the two surfaces of the semiconductor wafer 100. The device-forming region 47 is a region where devices are formed by processing the one of the two surfaces of the semiconductor wafer 100. The pre-semiconductor-chip portions 30P further include a plurality of electrode pads 48 disposed on the device-forming region 47, and a passivation film 49 disposed on the device-forming region 47. The passivation film 49 is made of an insulating material such as phospho-silicate-glass (PSG), silicon nitride, or polyimide resin. The passivation film 49 has a plurality of openings for exposing the top surfaces of the plurality of electrode pads 48. The plurality of electrode pads 48 are located in the positions corresponding to the plurality of electrodes to be formed later, and are electrically connected to the devices formed in the device-forming region 47. Hereinafter, the surface of the pre-substructure wafer 101 located closer to the plurality of electrode pads 48 and the passivation film 49 will be referred to as a first surface 101a, and the opposite surface will be referred to as a second surface 101b.

In the step of fabricating the layered substructure, next, a wafer sort test is performed to distinguish the plurality of pre-semiconductor-chip portions 30P included in the pre-substructure wafer 101 into non-malfunctioning pre-semiconductor-chip portions and malfunctioning pre-semiconductor-chip portions. In this step, a probe of a testing device is brought into contact with the plurality of electrode pads 48 of each pre-semiconductor-chip portion 30P so that whether the pre-semiconductor-chip portion 30P functions normally or not is tested with the testing device. In FIG. 9, the pre-semiconductor-chip portions 30P marked with "NG" are malfunctioning ones, and the other pre-semiconductor-chip portions 30P are non-malfunctioning ones. This step provides location information on non-malfunctioning pre-semiconductor-chip portions 30P and malfunctioning pre-semiconductor-chip portions 30P in each pre-substructure wafer 101. The location information is used in a step to be performed later. The passivation film 49 may be formed after the wafer sort test, and may thus be yet to be formed at the time of performing the wafer sort test.

Figure 12:
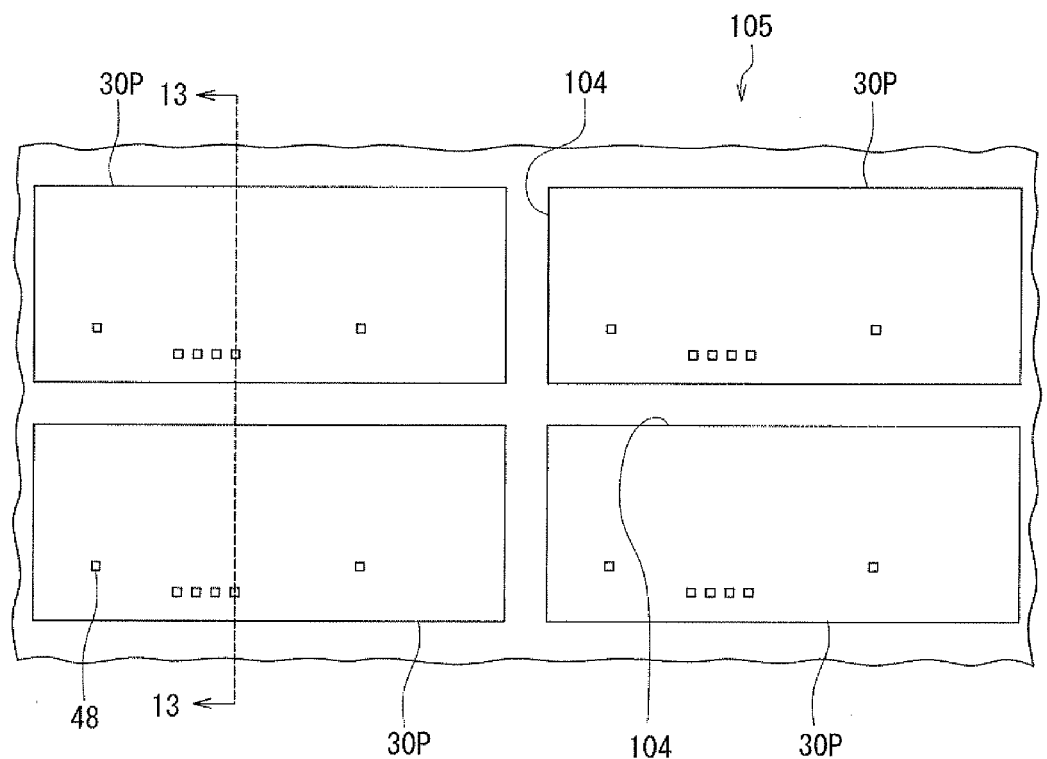
FIG. 12 is a plan view showing a step that follows the step shown in FIG. 10.
Figure 13:
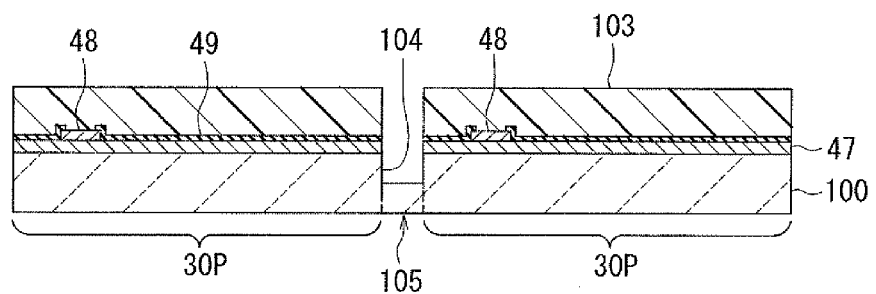
FIG. 13 shows a cross section taken along line 13-13 of FIG. 12.

FIG. 12 is a plan view showing a step that follows the step shown in FIG. 10. FIG. 13 shows a cross section taken along line 13-13 of FIG. 12. In this step, first, a protection layer 103 is formed to cover the first surface 101a of the pre-substructure wafer 101. The protection layer 103 is made of a photoresist, for example. Next, a plurality of grooves 104 that open in the first surface 101a of the pre-substructure wafer 101 are formed in the pre-substructure wafer 101 so as to define the respective areas of the plurality of pre-semiconductor-chip portions 30P. Note that the protection layer 103 is not shown in FIG. 12.

In the positions of boundaries between every two adjacent pre-semiconductor-chip portions 30P, the grooves 104 are formed to pass through the boundaries between every two adjacent pre-semiconductor-chip portions 30P. The grooves 104 are formed such that their bottoms do not reach the second surface 101b of the pre-substructure wafer 101. The grooves 104 have a width in the range of 50 to 150 µm, for example. The grooves 104 have a depth in the range of 20 to 80 µm, for example.

The grooves 104 may be formed using a dicing saw or by performing etching, for example. The etching may be reactive ion etching or anisotropic wet etching using KOH as the etching solution, for example. When forming the grooves 104 by etching, an etching mask may be formed by patterning the protection layer 103 by photolithography. The protection layer 103 is removed after the grooves 104 are formed. As a result, there is formed a pre-polishing substructure main body 105 which is composed of the pre-substructure wafer 101 with the plurality of grooves 104 formed therein.

Figure 14:
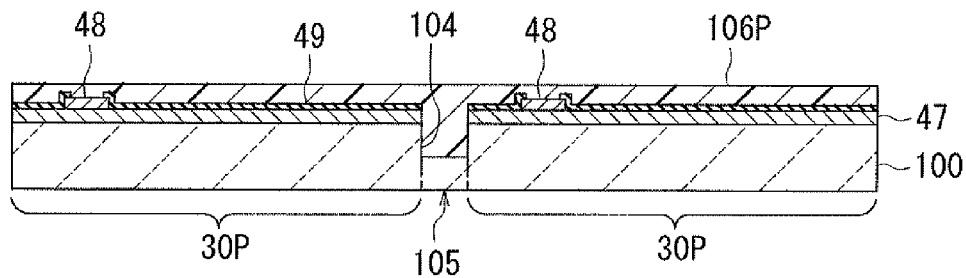
FIG. 14 is a cross-sectional view showing a step that follows the step shown in FIG. 13.

FIG. 14 shows a step that follows the step shown in FIG. 13. In this step, an insulating film 106P is formed to fill the plurality of grooves 104 of the pre-polishing substructure main body 105 and to cover the plurality of electrode pads 48 and the passivation film 49. The insulating film 106P is to later become part of the insulating portion 31. The insulating film 106P may be formed of a resin such as an epoxy resin or a polyimide resin. The insulating film 106P may also be formed of a photosensitive material such as a sensitizer-containing polyimide resin. The insulating film 106P may also be formed of an inorganic material such as silicon oxide or silicon nitride.

It is preferred that the insulating film 106P be formed of a resin having a low thermal expansion coefficient. If the insulating film 106P is formed of a resin having a low thermal expansion coefficient, it becomes easy to cut the insulating film 106P when it is cut later with a dicing saw.

The insulating film 106P is preferably transparent. If the insulating film 106P is transparent, alignment marks that are recognizable through the insulating film 106P can be formed on the insulating film 106P. Such alignment marks facilitates alignment of a plurality of substructures to be stacked.

The insulating film 106P may include a first layer that fills the plurality of grooves 104, and a second layer that covers the first layer, the electrode pads 48 and the passivation film 49. In such a case, the first layer and the second layer may be formed of the same material or different materials. The first layer is preferably formed of a resin having a low thermal expansion coefficient. The second layer may be formed of a photosensitive material such as a sensitizer-containing polyimide resin. The first layer may be flattened at the top by, for example, ashing or chemical mechanical polishing (CMP) before forming the second layer on the first layer.

If the passivation film 49 is not formed by the time of performing the wafer sort test, the second layer of the insulating film 106P may be used as the passivation film. In such a case, the second layer may be formed of an inorganic material such as silicon oxide or silicon nitride. If the second layer of the insulating film 106P is to be used as the passivation film, the plurality of openings for exposing the top surfaces of the plurality of electrode pads 48 are not formed in the second layer as initially formed.

Figure 15:
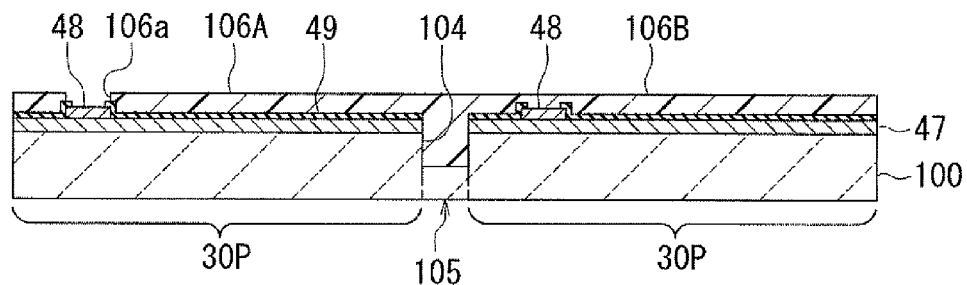
FIG. 15 is a cross-sectional view showing a step that follows the step shown in FIG. 14.

Reference is now made to FIG. 15 to describe the step of forming the plurality of openings for exposing the plurality of electrode pads 48 in the insulating film 106P in the non-malfunctioning pre-semiconductor-chip portions 30P. FIG. 15 shows a step that follows the step shown in FIG. 14.

Here, a description will initially be given of a case where either the entire insulating film 106P or the second layer of the insulating film 106P is formed of a negative photosensitive material and photolithography is employed to form the openings in the insulating film 106P. In this example, first, all the pre-semiconductor-chip portions 30P are simultaneously subjected to the exposure of the insulating film 106P by using a first mask (not shown). The first mask has such a pattern that the areas of the insulating film 106P where to form the openings are not irradiated with light while the other areas are irradiated with light. The non-irradiated areas of the insulating film 106P are soluble in a developing solution, and the irradiated areas become insoluble in the developing solution.

Next, using a stepping projection exposure apparatus, or a so-called stepper, the insulating film 106P is exposed selectively in the malfunctioning pre-semiconductor-chip portions 30P by using a second mask (not shown). This step uses the location information on non-malfunctioning pre-semiconductor-chip portions 30P and malfunctioning pre-semiconductor-chip portions 30P in each pre-substructure wafer 101 which was obtained by the wafer sort test. In FIG. 15, the pre-semiconductor-chip portion 30P on the left is a non-malfunctioning one, whereas the pre-semiconductor-chip portion 30P on the right is a malfunctioning one. The second mask entirely transmits light. As a result of this exposure process, the entire insulating film 106P in each malfunctioning pre-semiconductor-chip portion 30P becomes insoluble in the developing solution.

Next, the insulating film 106P is developed with the developing solution. As a result, as shown in FIG. 15, a plurality of openings 106a for exposing the plurality of electrode pads 48 are formed in the insulating film 106P in each non-malfunctioning pre-semiconductor-chip portion 30P (the left side). On the other hand, no openings 106a are formed in the insulating film 106P in each malfunctioning pre-semiconductor-chip portion 30P (the right side). After the development, the area of the insulating film 106P corresponding to the non-malfunctioning pre-semiconductor-chip portion 30P becomes a first-type insulating layer 106A, and the area corresponding to the malfunctioning pre-semiconductor-chip portion 30P becomes a second-type insulating layer 106B. The first-type insulating layer 106A has the plurality of openings 106a for exposing the plurality of electrode pads 48 and surrounds the plurality of electrode pads 48. The second-type insulating layer 106B covers the plurality of electrode pads 48 so as to avoid exposure.

Now, an example of the method for forming the plurality of openings 106a in the insulating film 106P will be described for the case where either the entire insulating film 106P or the second layer of the insulating film 106P is formed of a non-photosensitive material. In this example, first, a negative photoresist layer is formed on the insulating film 106P. The photoresist layer is then exposed and developed by the same method as with the exposure and development of the insulating film 106P described above. As a result, in the non-malfunctioning pre-semiconductor-chip portions 30P, a plurality of openings are formed in the photoresist layer at positions corresponding to the plurality of electrode pads 48. Meanwhile, no opening is formed in the photoresist layer in the malfunctioning pre-semiconductor-chip portions 30P. Next, the insulating film 106P is selectively etched by using the photoresist layer as the etching mask, whereby the plurality of openings 106a are formed in the insulating film 106P. The photoresist layer may be subsequently removed, or may be left and used as part of the insulating layers 106A and 106B.

Figure 16:
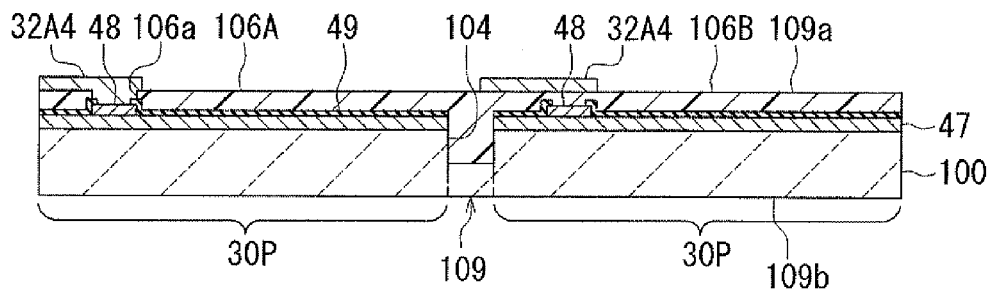
FIG. 16 is a cross-sectional view showing a step that follows the step shown in FIG. 15.
Figure 17:
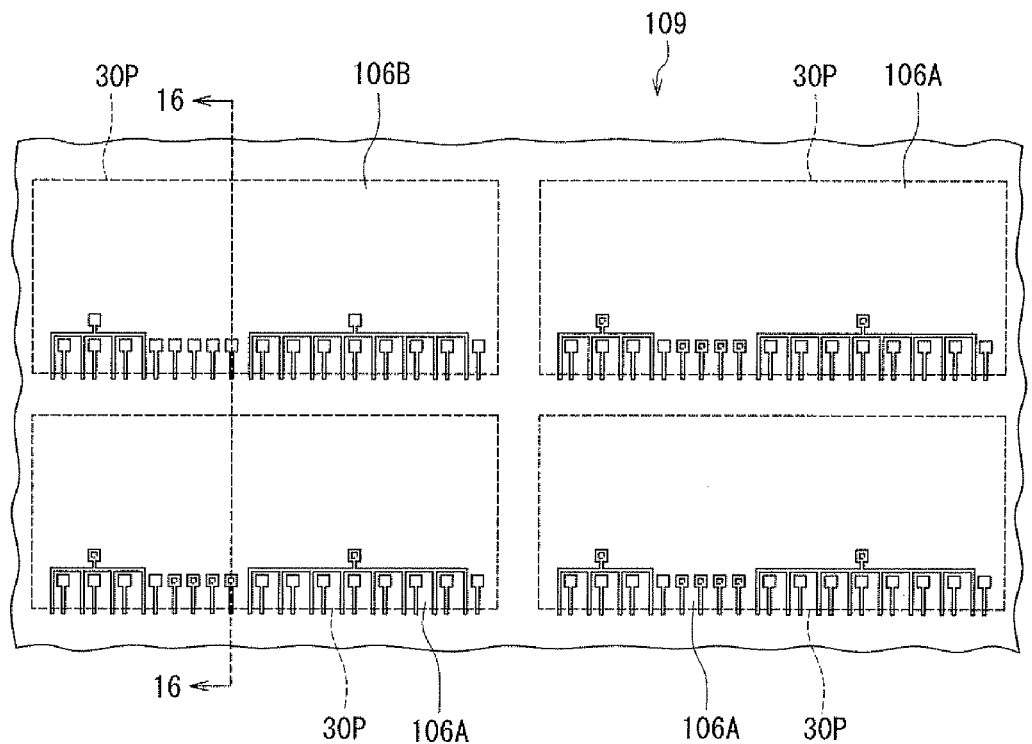
FIG. 17 is a plan view showing the step of FIG. 16.

FIG. 16 and FIG. 17 show a step that follows the step shown in FIG. 15. FIG. 16 shows a cross section taken along line 16-16 of FIG. 17. In this step, the plurality of electrodes are formed on the insulating layers 106A and 106B by plating, for example. In each of the non-malfunctioning pre-semiconductor-chip portions 30P, the first-type electrodes 32A1 to 32A4 and the fourth-type electrodes 32D1 and 32D2 among the plurality of electrodes are in contact with and electrically connected to the respective corresponding electrode pads 48 through the plurality of openings 106a of the insulating layer 106A. In each of the non-malfunctioning pre-semiconductor-chip portions 30P, the plurality of electrodes other than the first-type and fourth-type electrodes are not in contact with the pre-semiconductor-chip portion 30P. In each of the malfunctioning pre-semiconductor-chip portions 30P, on the other hand, none of the electrodes are in contact with the pre-semiconductor-chip portion 30P since no openings 106a are formed in the insulating layer 106B.

In this way, there is fabricated a pre-polishing substructure 109 shown in FIG. 16 and FIG. 17. The pre-polishing substructure 109 has a first surface 109a corresponding to the first surface 101a of the pre-substructure wafer 101, and a second surface 109b corresponding to the second surface 101b of the pre-substructure wafer 101.

The electrodes are formed of a conductive material such as Cu. In the case of forming the electrodes by plating, a seed layer for plating is initially formed. Next, a photoresist layer is formed on the seed layer. The photoresist layer is then patterned by photolithography to form a frame that has a plurality of openings in which the electrodes are to be accommodated later. Next, plating layers that are intended to constitute respective portions of the electrodes are formed by plating on the seed layer in the openings of the frame. The plating layers have a thickness in the range of 5 to 15 μm, for example. Next, the frame is removed, and portions of the seed layer other than those lying under the plating layers are also removed by etching. The plating layers and the remaining portions of the seed layer under the plating layers thus form the electrodes.

Figure 18:
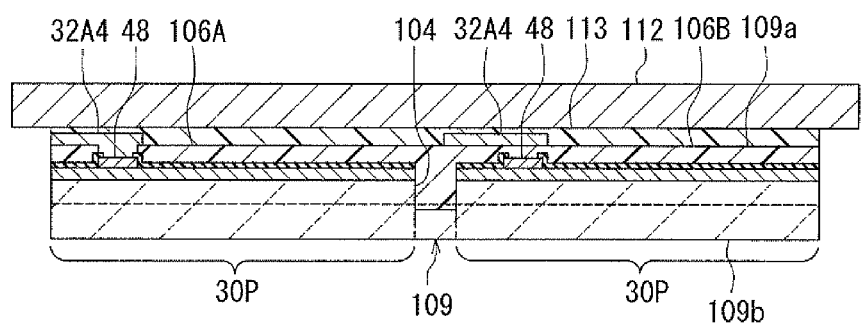
FIG. 18 is a cross-sectional view showing a step that follows the step shown in FIG. 16.

FIG. 18 shows a step that follows the step shown in FIG. 16. In this step, using an insulating adhesive, the pre-polishing substructure 109 is bonded to a plate-shaped jig 112 shown in FIG. 18, with the first surface 109a of the pre-polishing substructure 109 arranged to face a surface of the jig 112. The pre-polishing substructure 109 bonded to the jig 112 will hereinafter be referred to as a first pre-polishing substructure 109. In FIG. 18, the reference numeral 113 indicates an insulating layer formed by the adhesive. The insulating layer 113 is to become part of the insulating portion 31 later.

Figure 19:
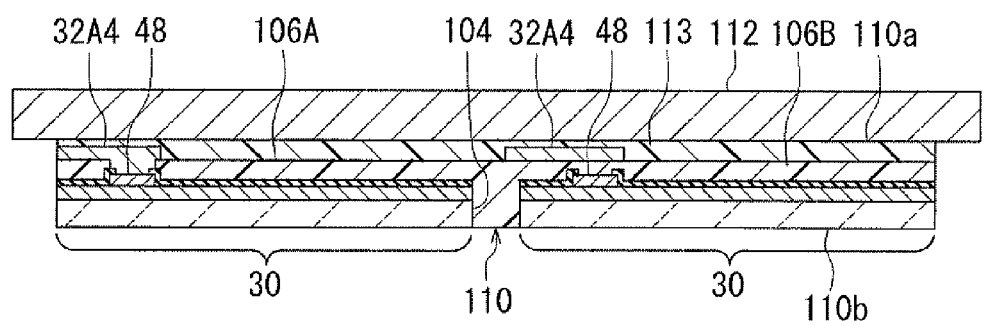
FIG. 19 is a cross-sectional view showing a step that follows the step shown in FIG. 18.

FIG. 19 shows a step that follows the step shown in FIG. 18. In this step, the second surface 109b of the first pre-polishing substructure 109 is polished. The polishing is performed until the plurality of grooves 104 are exposed. The broken line in FIG. 18 indicates the level of the second surface 109b after the polishing. By polishing the second surface 109b of the first pre-polishing substructure 109, the first pre-polishing substructure 109 is reduced in thickness, and a substructure 110 bonded to the jig 112 is thereby formed. The substructure 110 is 20 to 80 μm thick, for example. The substructure 110 bonded to the jig 112 will hereinafter be referred to as a first substructure 110. The first substructure 110 has a first surface 110a corresponding to the first surface 109a of the first pre-polishing substructure 109, and a second surface 110b opposite to the first surface 110a. The second surface 110b is the polished surface. By polishing the second surface 109b of the first pre-polishing substructure 109 until the plurality of grooves 104 are exposed, the plurality of pre-semiconductor-chip portions 30P are separated from each other into individual semiconductor chips 30. The first surface 110a of the first substructure 110 corresponds to the first surface 30a of the semiconductor chip 30 shown in FIG. 5. The second surface 110b of the first substructure 110 corresponds to the second surface 30b of the semiconductor chip 30 shown in FIG. 5.

Figure 20:
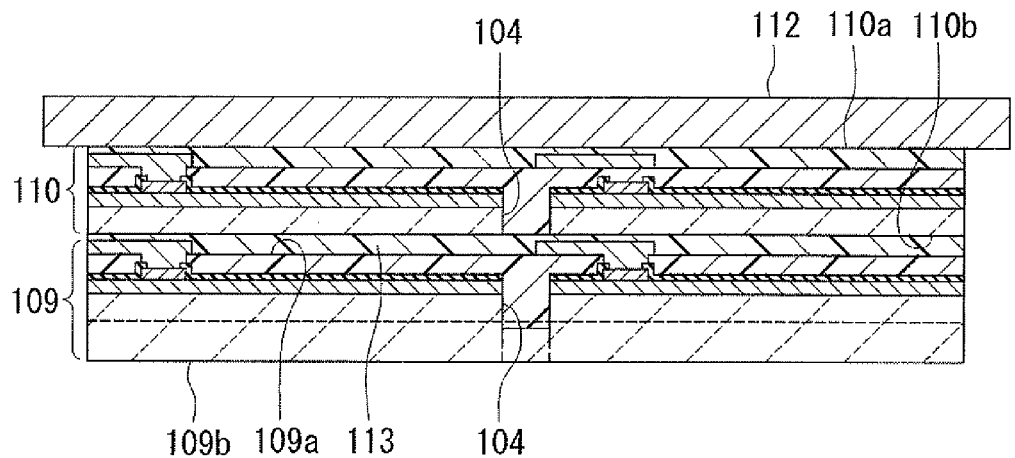
FIG. 20 is a cross-sectional view showing a step that follows the step shown in FIG. 19.

FIG. 20 shows a step that follows the step shown in FIG. 19. In this step, using an insulating adhesive, a pre-polishing substructure 109 is bonded to the first substructure 110 bonded to the jig 112. The pre-polishing substructure 109 is bonded to the first substructure 110 with the first surface 109a arranged to face the polished surface, i.e., the second surface 110b, of the first substructure 110. The pre-polishing substructure 109 bonded to the first substructure 110 will hereinafter be referred to as a second pre-polishing substructure 109. The insulating layer 113 formed of the adhesive between the first substructure 110 and the second pre-polishing substructure 109 covers the plurality of electrodes of the second pre-polishing substructure 109. The insulating layer 113 is to later become part of the insulating portion 31.

Figure 21:
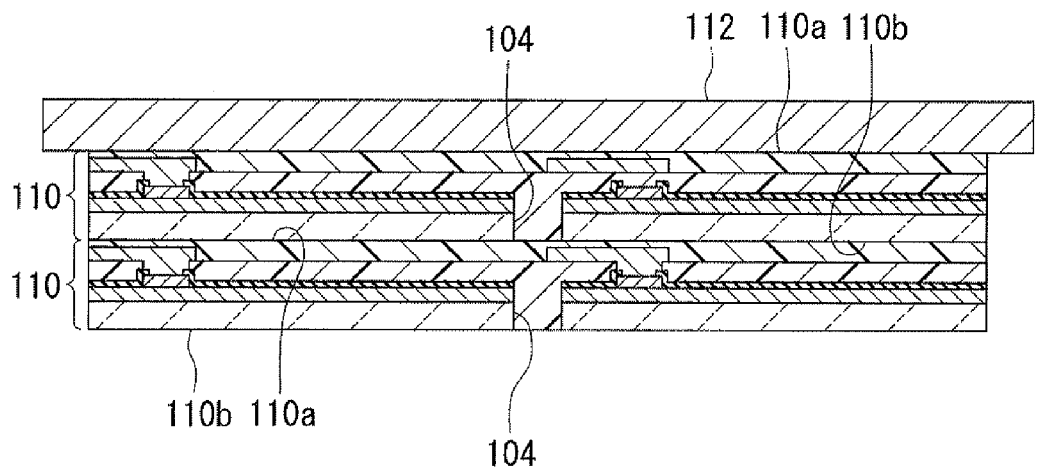
FIG. 21 is a cross-sectional view showing a step that follows the step shown in FIG. 20.

FIG. 21 shows a step that follows the step shown in FIG. 20. In this step, the second surface 109b of the second pre-polishing substructure 109 is polished. The polishing is performed until the plurality of grooves 104 are exposed. The broken line in FIG. 20 indicates the level of the second surface 109b after the polishing. By polishing the second surface 109b of the second pre-polishing substructure 109, the second pre-polishing substructure 109 is reduced in thickness, and a second substructure 110 bonded to the first substructure 110 is thereby formed. The second substructure 110 has a first surface 110a corresponding to the first surface 109a of the second pre-polishing substructure 109, and a second surface 110b opposite to the first surface 110a. For example, the second substructure 110 is 20 to 80 μm thick, as is the first substructure 110.

Figure 22:
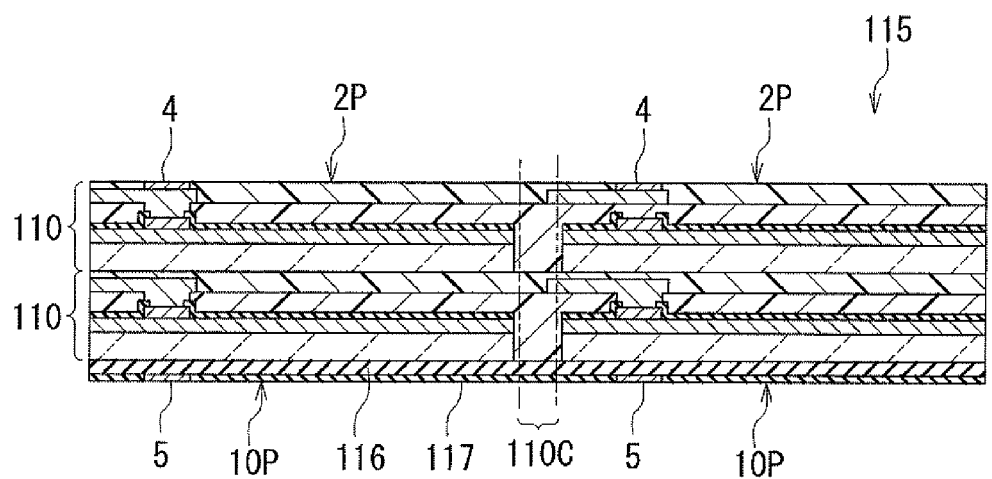
FIG. 22 is a cross-sectional view showing a part of a first layered substructure fabricated in a step that follows the step shown in FIG. 21.

FIG. 22 shows a step that follows the step shown in FIG. 21. In this step, first, the jigs 112 are released from the stack of two substructures 110. Next, a portion of the insulating layer 113 of the first substructure 110 is removed by, for example, etching, to expose portions of the plurality of electrodes except the electrodes 32D1 and 32D2, and a plurality of conductor pads are then formed. Then, a plurality of conductor layers are formed on the plurality of conductor pads to thereby form the plurality of first terminals 4. Portions of the plurality of electrodes covered by the insulating layer 113 form the top wiring 4W.

Next, an insulating layer 116, which is to become the insulating layer 8 later, is formed on the second surface 110b of the second substructure 110. Although not shown in the drawings, a plurality of conductor layers are then formed over the surface of the insulating layer 116 to thereby form the bottom wiring 5W and a plurality of conductor pads electrically connected to the bottom wiring 5W. Next, a plurality of conductor layers are formed on the plurality of conductor pads to thereby form the plurality of second terminals 5. The plurality of terminals 5 and the bottom wiring 5W are formed of a conductive material such as Cu or Au. An insulating layer 117 is then formed to cover the bottom wiring 5W.

At least either the terminals 4 or the terminals 5 may each include a solder layer made of a solder material, the solder layer being exposed in the surface of each of the terminals 4 or each of the terminals 5. An example of the solder material is AuSn. The solder layer has a thickness in the range of 1 to 2 μm, for example. The solder layer is formed on the surface of each of the conductor pads directly or via an underlayer by plating, for example.

AuSn is highly adhesive to Au. When either the terminals 4 or the terminals 5 each include a solder layer made of AuSn, it is preferred that the other of the terminals 4 and 5 each include an Au layer that is exposed in the surface of each of the terminals 4 or 5. The Au layer is formed by plating or sputtering, for example. The melting point of AuSn varies according to the ratio between Au and Sn. For example, if the ratio between Au and Sn is 1:9 by weight, AuSn has a melting point of 217° C. If the ratio between Au and Sn is 8:2 by weight, AuSn has a melting point of 282° C.

In this way, there is formed a first layered substructure 115 including two substructures 110 stacked, as shown in FIG. 22. Each of the substructures 110 includes a plurality of preliminary layer portions 10P that are arrayed. Each of the preliminary layer portions 10P is to become any one of the layer portions 10 included in the main part 2M of the main body 2. The substructures 110 are to be cut later in the positions of the boundaries between every adjacent preliminary layer portions 10P. In FIG. 22, the reference symbol 110C indicates the cutting positions in the substructures 110. The first layered substructure 115 includes a plurality of pre-separation main bodies 2P that are arrayed. The plurality of pre-separation main bodies 2P are to be separated from each other later into individual main bodies 2. Each single pre-separation main body 2P includes two preliminary layer portions 10P.

Now, with reference to FIG. 23 to FIG. 26, a detailed description will be given of the step of producing a plurality of subpackages 1S by using the first layered substructure 115.

Figure 23:
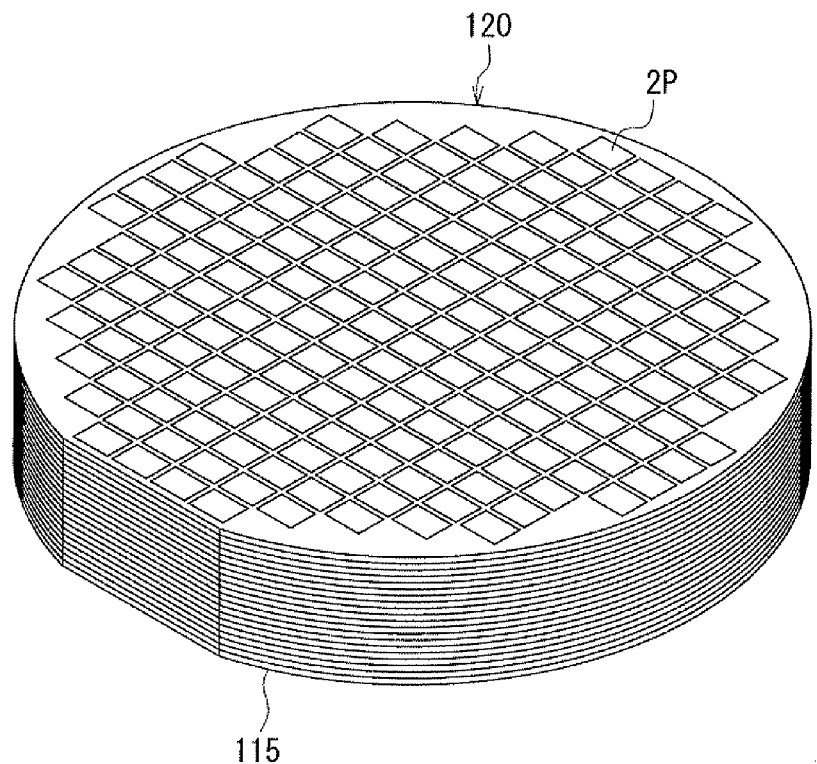
FIG. 23 is a perspective view showing a second layered substructure fabricated in a step that follows the step shown in FIG. 22.
Figure 24:
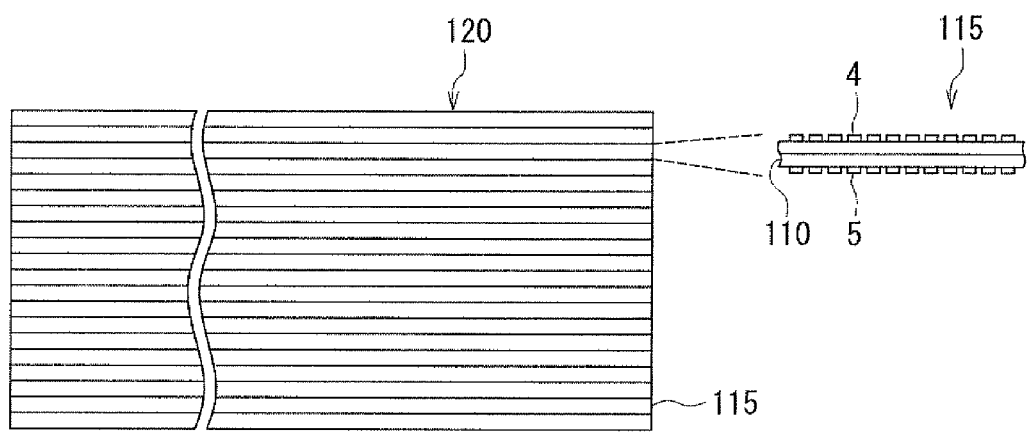
FIG. 24 is a side view of the second layered substructure shown in FIG. 23.

FIG. 23 and FIG. 24 show a step that follows the step shown in FIG. 22. In this step, a plurality of first layered substructures 115 are stacked on each other and every two vertically adjacent first layered substructures 115 are bonded to each other to fabricate a second layered substructure 120. FIG. 23 and FIG. 24 show an example where 20 first layered substructures 115 are stacked to fabricate the second layered substructure 120. Every two vertically adjacent first layered substructures 115 are bonded to each other with an adhesive so as to be easily detachable. In this example, as shown in FIG. 24, the second layered substructure 120 includes a stack of 20 first layered substructures 115, each of the first layered substructures 115 including a stack of two substructures 110. The second layered substructure 120 therefore includes a stack of 40 substructures 110. Suppose that each individual substructure 110 has a thickness of 50 μm. Ignoring the thickness of the adhesive that bonds the two substructures 110 to each other and the thickness of the adhesive that bonds every two vertically adjacent first layered substructures 115 to each other, the second layered substructure 120 has a thickness of 50 μm×40, i.e., 2 mm.

Figure 25:
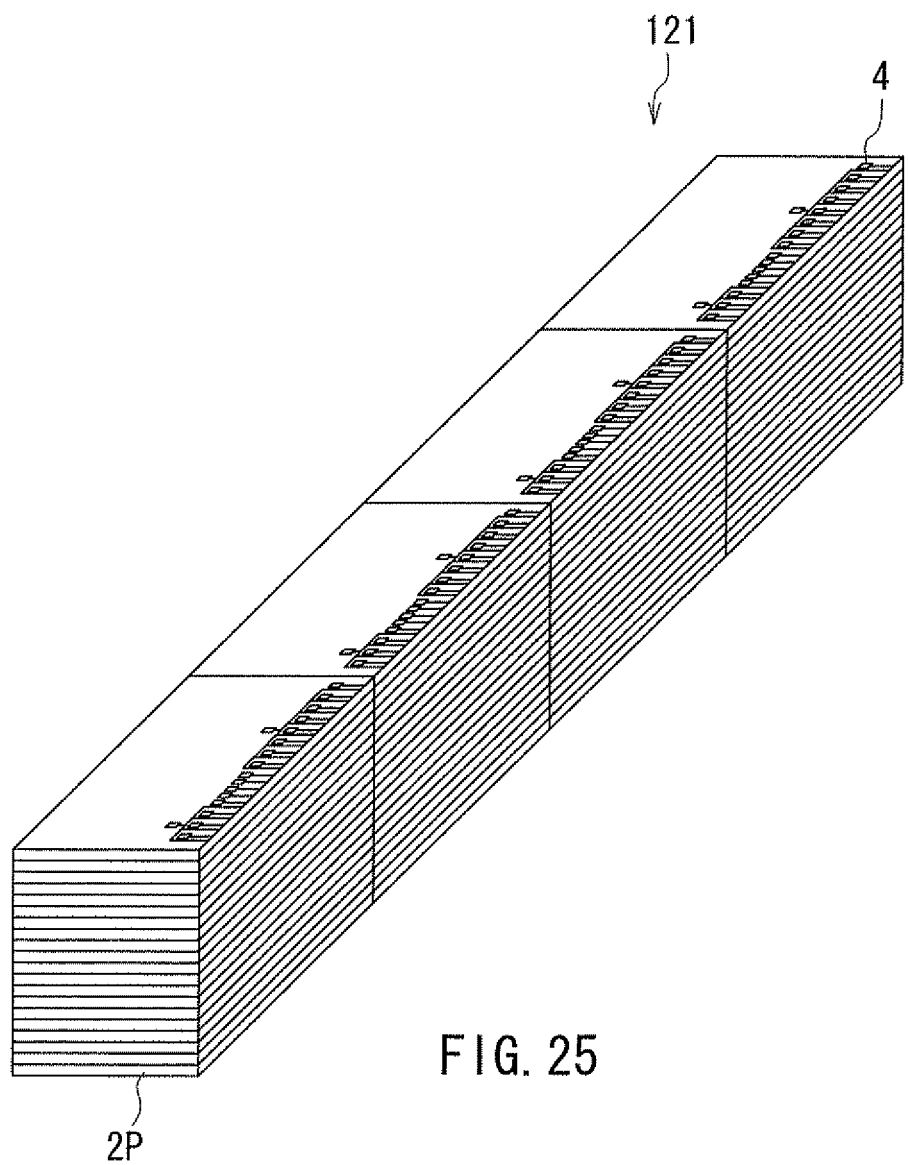
FIG. 25 is a perspective view showing an example of a block obtained by cutting the second layered substructure.

FIG. 25 shows a step that follows the step shown in FIG. 23 and FIG. 24. In this step, first, the second layered substructure 120 is cut into at least one block 121 in which a plurality of pre-separation main bodies 2P align both in the stacking direction of the first layered substructures 115 and a direction orthogonal to the stacking direction. FIG. 25 shows an example of the block 121. In the block 121 shown in FIG. 25, twenty pre-separation main bodies 2P align in the stacking direction of the first layered substructures 115, and four pre-separation main bodies 2P align in the direction orthogonal to the stacking direction of the first layered substructures 115. In this example, the block 121 includes eighty pre-separation main bodies 2P.

Next, the wiring 3 is simultaneously formed on all the pre-separation main bodies 2P included in the block 121. In the case of forming the wiring 3 by plating, a seed layer for plating is formed first. Then, a photoresist layer is formed on the seed layer and the photoresist layer is patterned by photolithography to form a frame having a plurality of openings in which a plurality of units of wiring 3 corresponding to the plurality of pre-separation main bodies 2P are to be accommodated later. Next, plating layers to constitute portions of the wiring 3 are formed by plating on the seed layer in the openings of the frame. The frame is then removed, and portions of the seed layer other than those lying under the plating layers are also removed by etching. The plating layers and the remaining portions of the seed layer under the plating layers thus form the wiring 3. The wiring 3 is formed for each of the pre-separation main bodies 2P.

Figure 26:
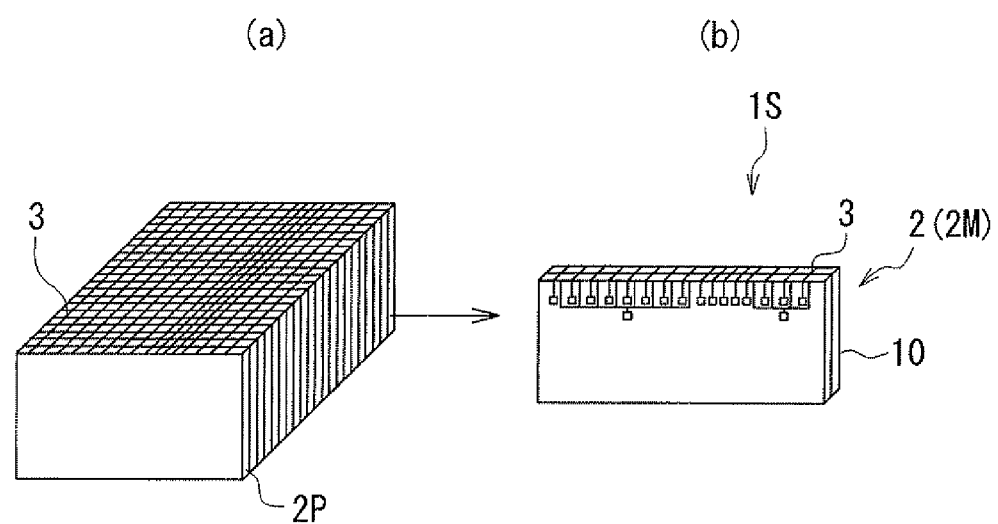
FIG. 26 is an explanatory diagram showing a step that follows the step shown in FIG. 25.

The process for forming the subpackages 1S then proceeds to the step of separating the plurality of pre-separation main bodies 2P, each of which has the wiring 3, from each other so that a plurality of subpackages 1S are produced. This step will be described with reference to FIG. 26. In this step, first, the block 121 is cut in the positions of the boundaries between every two pre-separation main bodies 2P that are adjacent to each other in the direction orthogonal to the stacking direction of the pre-separation main bodies 2P. This produces a plurality of stacks shown in portion (a) of FIG. 26. Each of the stacks includes a plurality of pre-separation main bodies 2P stacked on each other. In each of the stacks, every two adjacent pre-separation main bodies 2P are easily detachably bonded to each other by the adhesive that was used to bond every two vertically adjacent first layered substructures 115 when fabricating the second layered substructure 120 in the step shown in FIG. 23 and FIG. 24. Next, the plurality of pre-separation main bodies 2P included in the stack shown in portion (a) of FIG. 26 are separated from each other. This makes the pre-separation main bodies 2P into main bodies 2, and as a result, there are produced a plurality of subpackages 1S each of which includes the main body 2 and the wiring 3. Portion (b) of FIG. 26 shows one of the subpackages 1S.

A plurality of subpackages 1S are thus produced through the series of steps that have been described with reference to FIG. 9 to FIG. 26. So far the description has dealt with the case where the first layered substructure 115 including two substructures 110 as shown in FIG. 22 is used to produce a plurality of subpackages 1S each of which includes two layer portions 10. As will be described in relation to other embodiments, however, the number of the substructures 110 to be included in the first layered substructure 115 can be varied to produce subpackages 1S with different numbers of layer portions 10.

As has been described, the composite layered chip package 1 according to the present embodiment includes a plurality of subpackages 1S stacked on each other, every two vertically adjacent subpackages 1S being electrically connected to each other. Each subpackage 1S has the wiring 3 including a plurality of wires W disposed on at least one of the side surfaces of the main body 2. The main body 2 includes: the main part 2M including a plurality of layer portions 10 stacked on each other; the plurality of first terminals 4 disposed on the top surface 2Ma of the main part 2M; and the plurality of second terminals 5 disposed on the bottom surface 2Mb of the main part 2M. Both the first and second terminals 4 and 5 are electrically connected to the plurality of wires W. With the subpackages 1S of such a configuration, it is possible to establish electrical connection between two or more subpackages 1S by stacking the two or more subpackages 1S on each other and electrically connecting the second terminals 5 of the upper one of two vertically adjacent subpackages 1S to the first terminals 4 of the lower one.

Each layer portion 10 includes a semiconductor chip 30, and a plurality of electrodes electrically connected to the plurality of wires W. In the present embodiment, the plurality of first terminals 4 are formed by using the plurality of electrodes of the first layer portion L11 to L51 located closest to the top surface 2Ma of the main part 2M. The present embodiment thus allows the plurality of first terminals 4 to be formed easily.

Consequently, according to the present embodiment, a plurality of subpackages 1S that are able to be stacked on each other and electrically connected to each other are obtainable at low cost. This makes it possible to provide a package including a desired number of semiconductor chips 30 at low cost.

In the present embodiment, the plurality of electrodes are arranged in the same layout in the plurality of layer portions 10. This can further reduce the manufacturing cost of the subpackages 1S.

Figure 27:
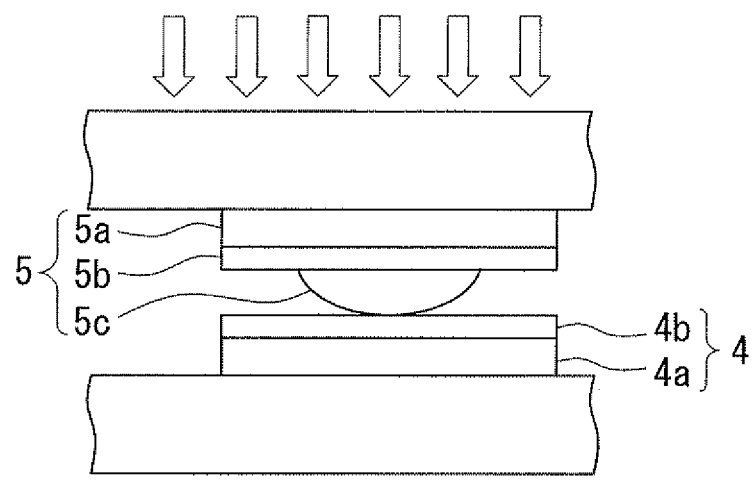
FIG. 27 is a side view showing connecting parts of the terminals of two vertically adjacent subpackages.
Figure 28:
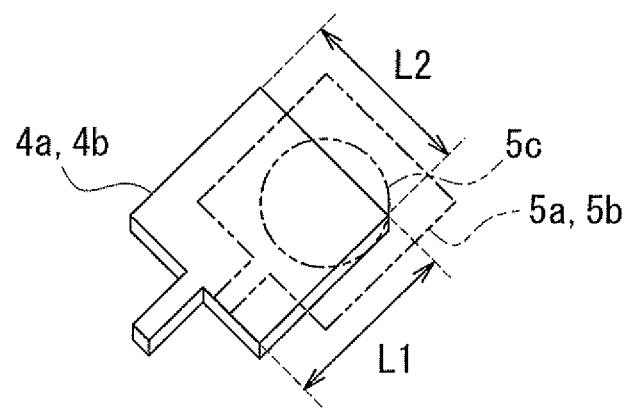
FIG. 28 is an explanatory diagram for explaining misalignment between the terminals of two vertically adjacent subpackages.

Moreover, the present embodiment facilitates the alignment between every two vertically adjacent subpackages 1S when stacking a plurality of subpackages 1S on each other. This advantageous effect will now be described with reference to FIG. 27 and FIG. 28. FIG. 27 is a side view showing connecting parts of the terminals of two vertically adjacent subpackages 1S. FIG. 28 is an explanatory diagram for explaining misalignment between the terminals of two vertically adjacent subpackages 1S.

In the example shown in FIG. 27 and FIG. 28, the terminal 4 includes a conductor pad 4a of rectangular shape and an Au layer 4b that is formed on the surface of the conductor pad 4a. The conductor pad 4a constitutes a part of the electrode, and is made of Cu, for example. The terminal 5 includes a conductor pad 5a of rectangular shape, an underlayer 5b formed on the surface of the conductor pad 5a, and a solder layer 5c formed on the surface of the underlayer 5b. The conductor pad 5a is made of Cu, for example. The underlayer 5b is made of Au, and the solder layer 5c is made of AuSn. Alternatively, contrary to this example, it is possible that the terminal 4 includes a conductor pad, an underlayer and a solder layer, while the terminal 5 includes a conductor pad and an Au layer. Both of the terminals 4 and 5 may include a solder layer. Here, the lengths of two orthogonal sides of the conductor pad 4a will be represented by L1 and L2. L1 and L2 are both 40 to 80 μm, for example. The conductor pad 5a has the same shape as that of the conductor pad 4a.

In the example shown in FIG. 27, the corresponding terminals 4 and 5 of the two vertically adjacent subpackages 1S are electrically connected in the following way. The Au layer 4b and the solder layer 5c of the corresponding terminals 4 and 5 are put into contact with each other. By applying heat and pressure, the solder layer 5c is melted, and then solidified to bond the terminals 4 and 5 to each other.

FIG. 28 shows a state where the terminals 4 and 5 are out of alignment. The state where the terminals 4 and 5 are out of alignment refers to the state where the edges of the conductor pad 4a and those of the conductor pad 5a do not coincide in position with each other when viewed in a direction perpendicular to the plane of the conductor pads 4a and 5a. In the present embodiment, the corresponding terminals 4 and 5 may be out of alignment as long as the terminals 4 and 5 can be bonded with a sufficiently small resistance at the interface between the terminals 4 and 5. Assuming that L1 and L2 are 30 to 60 μm, the maximum permissible misalignment between the terminals 4 and 5 is smaller than L1 and L2 yet several tens of micrometers.

According to the present embodiment, some misalignment between the terminals 4 and 5 is thus acceptable when stacking a plurality of subpackages 1S. This facilitates the alignment between two vertically adjacent subpackages 1S. Consequently, according to the present embodiment, it is possible to reduce the manufacturing cost of the composite layered chip package 1.

Figure 29:
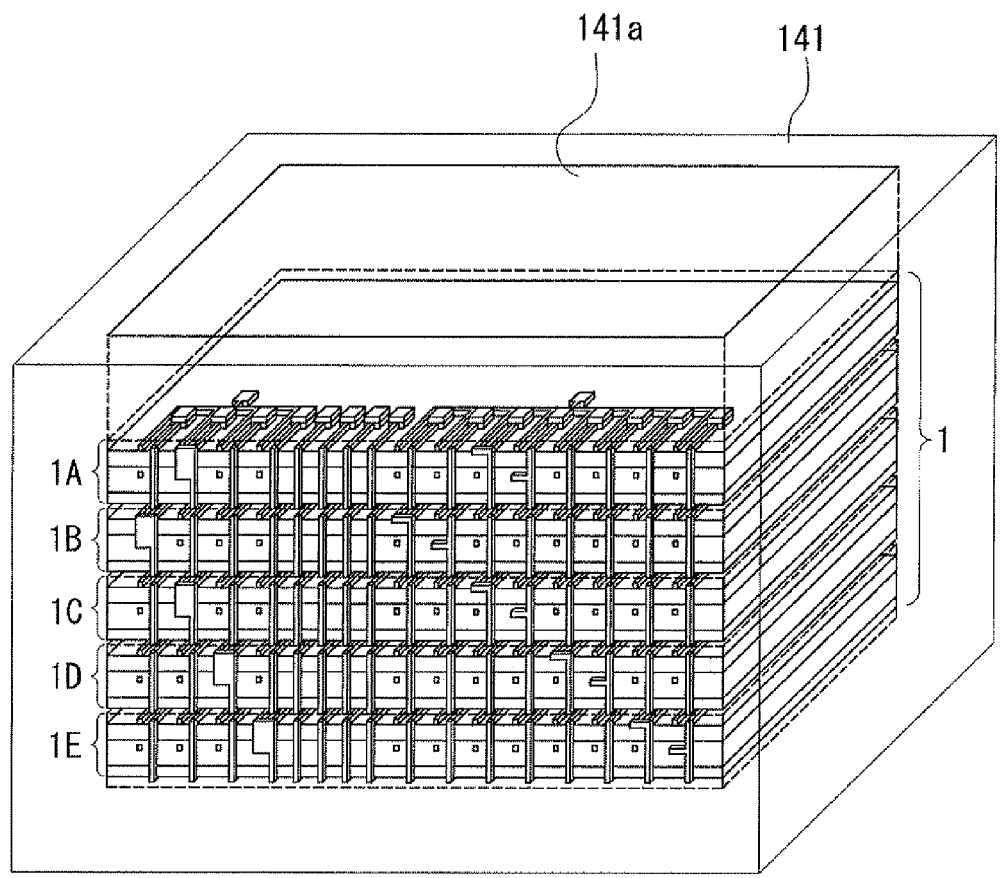
FIG. 29 is a perspective view showing an example of the method of stacking five subpackages.

FIG. 29 shows an example of a method of manufacturing a composite layered chip package 1 that includes five subpackages 1S stacked on each other. The method shown in FIG. 29 uses a heatproof container 141. The container 141 has an accommodation part 141a in which a plurality of subpackages 1S can be stacked and accommodated. The accommodation part 141a has such a size that the side surfaces of the subpackages 1S accommodated in the accommodation part 141a and the inner walls of the accommodation part 141a leave a slight gap therebetween. In the method, the plurality of subpackages 1S are stacked and accommodated in the accommodation part 141a of the container 141, and then the container 141 and the plurality of subpackages 1S are heated at temperatures at which the solder layer melts (for example, 320° C.). This melts the solder layer, and the terminals 4 and 5 of every two vertically adjacent subpackages 1S are thereby bonded to each other. This method allows a plurality of subpackages 1S to be aligned with each other easily by stacking and accommodating the plurality of subpackages 1S in the accommodation part 141a of the container 141. This makes it easy to manufacture the composite layered chip package 1. FIG. 29 shows an example where five subpackages 1A to 1E are stacked to fabricate a composite layered chip package 1.

In the composite layered chip package 1 according to the present embodiment, the plurality of layer portions 10 in every one of the plurality of subpackages 1S include at least one first-type layer portion 10A. The semiconductor chip 30 of the first-type layer portion 10A is non-malfunctioning, and is electrically connected to the wiring 3. According to the present embodiment, it is possible to construct a composite layered chip package 1 including a desired number of first-type layer portions 10A by using a plurality of subpackages 1S.

In the present embodiment, the number of the plurality of layer portions 10 included in the main part 2M is the same for all the plurality of subpackages 1S. According to the present embodiment, it is therefore possible to fabricate all the subpackages 1S through the same series of steps described with reference to FIG. 9 to FIG. 26. The present embodiment thus allows a reduction in the manufacturing cost of the subpackages 1S.

In the present embodiment, the plurality of layer portions 10 in each of at least two of the plurality of subpackages 1S further include at least one second-type layer portion 10B. The semiconductor chip 30 of the second-type layer portion 10B is not electrically connected to the wiring 3. The semiconductor chip 30 of the second-type layer portion 10B may thus be a defective semiconductor chip 30. According to the present embodiment, it is thus possible to use a greater number of subpackages 1S that include defective semiconductor chips 30.

Suppose, for example, that one of the subpackages 1B to 1E is a subpackage 1S that includes a second-type layer portion 10B (a defective semiconductor chip 30) as in the example shown in FIG. 1 and FIG. 7. In such a case, an additional subpackage 1S complementary to the aforementioned subpackage 1S is prepared so that a composite layered chip package 1 can be constructed by using the subpackages 1B to 1E and the additional subpackage 1S. The additional subpackage 1S includes a second-type layer portion 10B. The additional subpackage 1S can thus be prepared by making efficient use of a subpackage 1S that includes a defective semiconductor chip 30.

Similarly, suppose that each of two or more of the subpackages 1B to 1E is a subpackage 1S that includes a second-type layer portion 10B (a defective semiconductor chip 30). In such a case, two or more additional subpackages 1S complementary to the aforementioned two or more subpackages 1S are prepared so that a composite layered chip package 1 can be constructed by using the subpackages 1B to 1E and the additional subpackages 1S. According to the present embodiment, it is thus possible to make efficient use of subpackages 1S that include defective semiconductor chips 30.

The locations of the second-type layer portions 10B in the composite layered chip package 1 can be known from the location information on non-malfunctioning pre-semiconductor-chip portions 30P and malfunctioning pre-semiconductor-chip portions 30P which was obtained by the wafer sort test.

The semiconductor chip 30 of the second-type layer portion 10B in an additional subpackage 1S is not limited to defective one and may be conforming one. More specifically, in any layer portion 10 that includes a conforming semiconductor chip 30, electrical connection of the plurality of electrodes to the semiconductor chip 30 may be intentionally omitted to thereby form an additional subpackage 1S that includes a second-type layer portion 10B. This makes it possible that, no matter which layer portion 10 in the subpackages 1B to 1E is the second-type layer portion 10B, an additional subpackage 1S for compensating for the functions of the second-type layer portion 10B can be prepared without fail. Intentionally omitting electrical connection of the plurality of electrodes to a conforming semiconductor chip 30 in any layer portion 10 including the conforming semiconductor chip 30 can be accomplished in the step shown in FIG. 15, specifically, by omitting the formation of the plurality of openings 106a in the insulating film 106P in a non-malfunctioning pre-semiconductor-chip portion 30P.

As has been described, according to the present embodiment, it is possible to provide easily and at low cost a package that includes a plurality of semiconductor chips 30 stacked on each other and that performs, even if one or more of the semiconductor chips 30 are defective, the same functions as those in the case without any defective semiconductor chip 30.

In the present embodiment, defective semiconductor chips 30 are not electrically connected to the wiring 3. The defective semiconductor chips 30 may thus be regarded as a mere insulating layer. Consequently, according to the present embodiment, it is possible to disable the defective semiconductor chips 30 and to prevent the defective semiconductor chips 30 from causing malfunction of the layered chip package.

According to the present embodiment, even if the second-type layer portion 10B is located uppermost in a subpackage 1S, it is still possible to form the plurality of first terminals 4 by using the plurality of electrodes. The plurality of electrodes of the layer portion 10B do not have the function of electrically connecting the semiconductor chip 30 to the wiring 3, but have an interposer function of electrically connecting a subpackage 1S to another subpackage 1S.

Each layer portion 10 includes the first-type and fourth-type electrodes that are used for electrical connection to the semiconductor chip 30, and the second-type and third-type electrodes that are not in contact with the semiconductor chip 30. Regardless of whether the uppermost layer portion 10 (the first layer portion) is a first-type layer portion 10A or a second-type layer portion 10B, the second-type and third-type electrodes do not have the function of electrically connecting the semiconductor chip 30 to the wiring 3, but have an interposer function of electrically connecting a subpackage 1S to another subpackage 1S.

In the present embodiment, the plurality of wires W include a plurality of common wires WA that are used for a purpose common to all the layer portions 10 in the composite layered chip package 1, and a plurality of layer-dependent wires WB that are used by different ones of the plurality of layer portions 10. As shown in FIG. 1 to FIG. 3, each layer-dependent wire WB is broadened in part, and is thereby electrically connected to the fourth-type electrode 32D1 or 32D2 of the layer portion 10 that uses the layer-dependent wire WB. Such a configuration of the present embodiment allows the semiconductor chips 30 to be electrically connected to respective different layer-dependent wires WB from one layer portion 10 to another while allowing the electrodes 32D1 and 32D2 to have the same layout in all the layer portions 10 in the composite layered chip package 1. This allows the composite layered chip package 1 to be manufactured easily.

In the present embodiment, the method of manufacturing a plurality of subpackages 1S includes the steps of: fabricating a plurality of substructures 110; fabricating a plurality of first layered substructures 115 by using the plurality of substructures 110, each of the plurality of first layered substructures 115 including two substructures 110 stacked; and producing a plurality of subpackages 1S from the plurality of first layered substructures 115. Each of the first layered substructures 115 includes a plurality of pre-separation main bodies 2P that are arrayed. The plurality of pre-separation main bodies 2P are to be separated from each other later into individual main bodies 2.

The step of producing a plurality of subpackages 1S includes the steps of fabricating the second layered substructure 120 by stacking the plurality of first layered substructures 115 on each other and bonding every two adjacent first layered substructures 115 to each other; cutting the second layered substructure 120 into at least one block 121 including a plurality of pre-separation main bodies 2P that align both in the stacking direction of the first layered substructures 115 and in the direction orthogonal to the stacking direction; forming the wiring 3 on the plurality of pre-separation main bodies 2P included in the at least one block 121 simultaneously; and separating the plurality of pre-separation main bodies 2P each provided with the wiring 3 from each other so as to produce the plurality of subpackages 1S.

According to such a method of manufacturing the subpackages 1S, it is possible to simultaneously form a plurality of sets of the terminals 4 and 5 corresponding to a plurality of subpackages 1S in the step of fabricating the first layered substructure 115. In addition, according to this manufacturing method, the wiring 3 is formed simultaneously on a plurality of pre-separation main bodies 2P included in the block 121 in the manner described with reference to FIG. 25. This allows a plurality of units of wiring 3 corresponding to a plurality of subpackages 1S to be formed simultaneously. Here, it is unnecessary to perform alignment between the plurality of pre-separation main bodies 2P included in the block 121. This manufacturing method thus makes it possible to mass-produce, at low cost in a short time, a plurality of subpackages 1S that are able to be electrically connected to each other easily.

The foregoing method of manufacturing the subpackages 1S achieves a reduction in the number of steps and consequently allows a reduction in cost of the subpackages 1S, as compared with the method of manufacturing a layered chip package disclosed in U.S. Pat. No. 5,953,588.

In the foregoing method of manufacturing the subpackages 1S, the first layered substructure 115 is fabricated in the manner described with reference to FIG. 18 to FIG. 22. This allows the two substructures 110 making up the first layered substructure 115 to be reduced in thickness easily while preventing damage to the substructures 110. The present embodiment thus makes it possible to manufacture a compact and highly integrated subpackage 1S with a high yield.

According to the present embodiment, in the subpackage 1S including a plurality of stacked semiconductor chips 30, the stacked semiconductor chips 30 are electrically connected to each other by the wiring 3 (the plurality of wires W) disposed on at least one of the side surfaces of the main body 2. Consequently, the present embodiment is free from the problems of the wire bonding method, that is, the problem that it is difficult to reduce the distance between electrodes so as to avoid contact between wires, and the problem that the high resistances of the wires hamper quick circuit operation.

As compared with the through electrode method, the present embodiment has the following advantages. First, the present embodiment does not require the formation of through electrodes in each chip and consequently does not require a large number of steps for forming through electrodes in each chip. Moreover, the present embodiment provides higher reliability of electrical connection between a plurality of chips as compared with the case where through electrodes are used to establish electrical connection between the chips.

Furthermore, according to the present embodiment, it is possible to easily change the line width and thickness of the wiring 3. Consequently, it is possible to easily cope with future demands for finer wiring 3.

The through electrode method requires that the through electrodes of vertically adjacent chips be connected to each other by means of, for example, soldering at high temperatures. In contrast to this, the present embodiment allows the wiring 3 to be formed by, for example, plating, and thus allows the formation of the wiring 3 at lower temperatures. Furthermore, the present embodiment allows the plurality of layer portions 10 to be bonded to each other at low temperatures. This makes it possible to prevent the semiconductor chips 30 from suffering damage from heat.

The through electrode method further requires accurate alignment between vertically adjacent chips in order to connect the through electrodes of the vertically adjacent chips to each other. In contrast, according to the present embodiment, electrical connection between a plurality of semiconductor chips 30 is established not at an interface between two vertically adjacent layer portions 10 but through the use of the wiring 3 disposed on at least one of the side surfaces of the main body 2. The accuracy of alignment between the plurality of layer portions 10 can therefore be lower than the accuracy of alignment between a plurality of chips required for the through electrode method.

Second Embodiment

Figure 30:
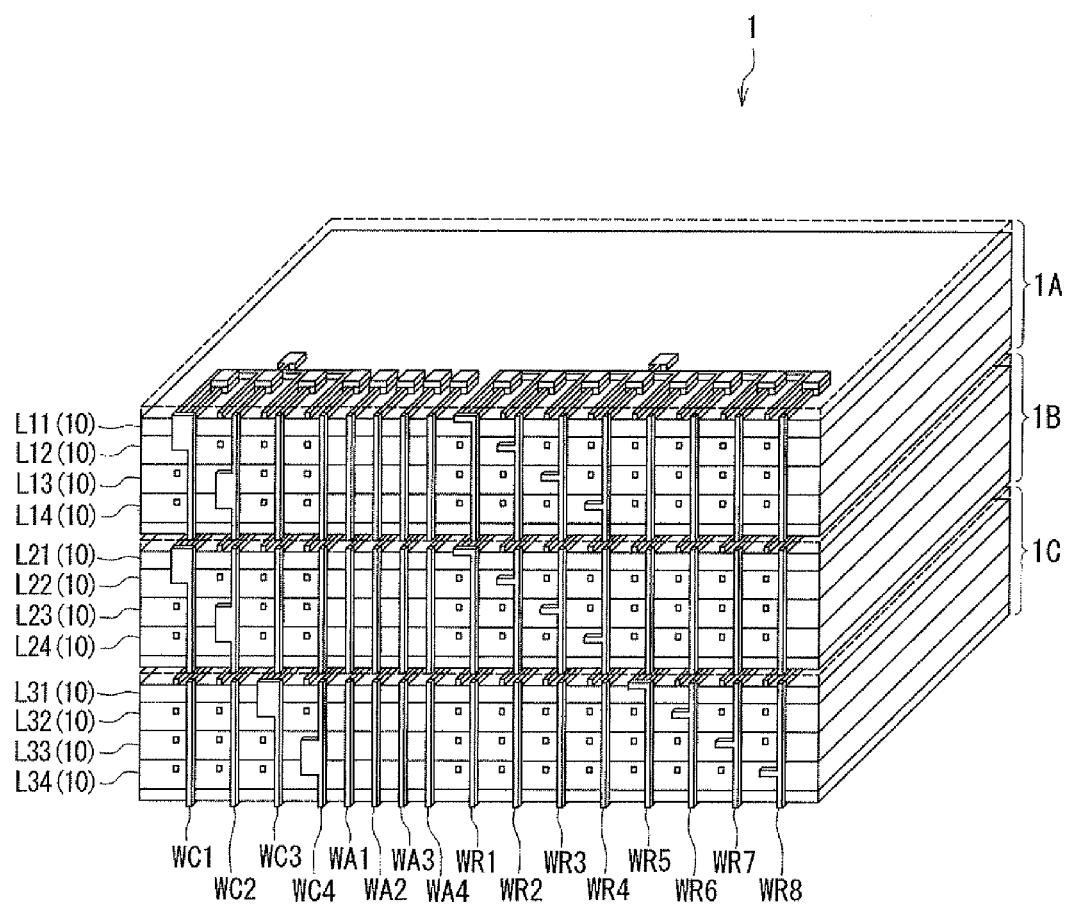
FIG. 30 is a perspective view of a composite layered chip package according to a second embodiment of the invention.
Figure 31:
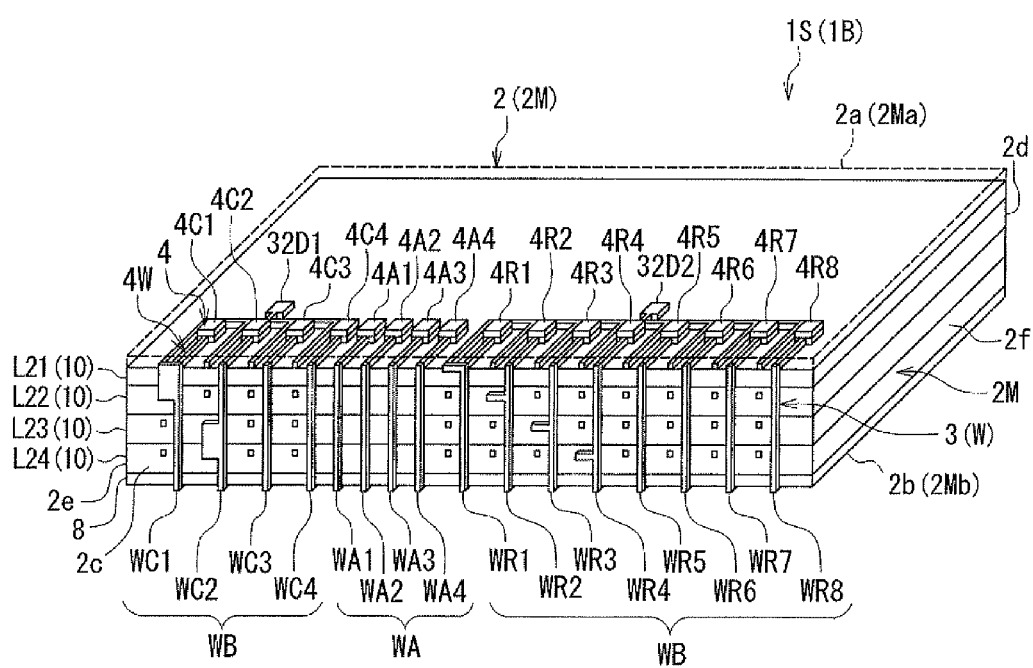
FIG. 31 is a perspective view of a subpackage of the second embodiment of the invention.
Figure 32:
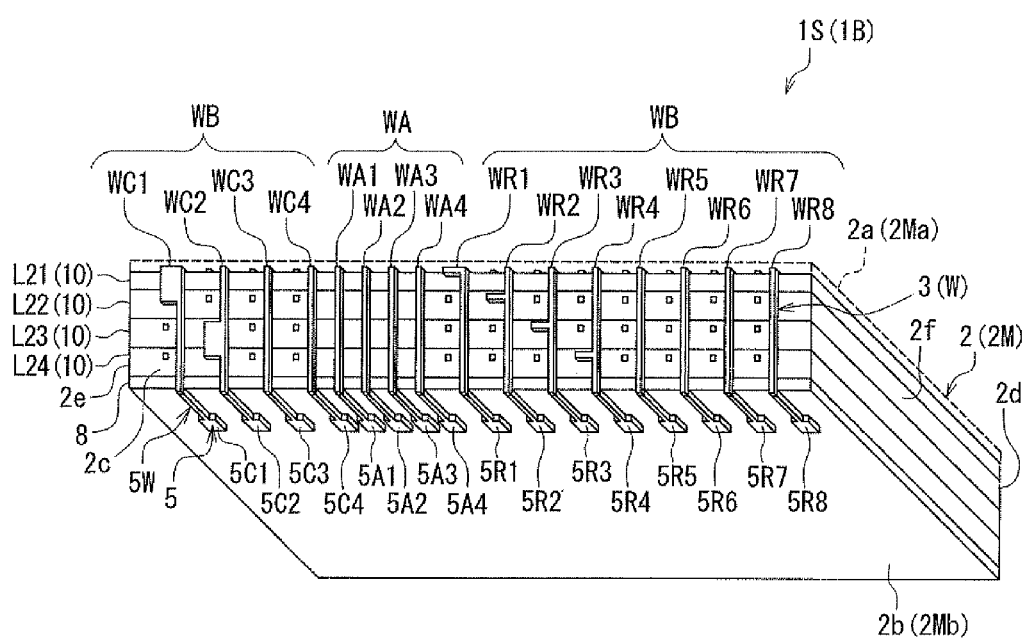
FIG. 32 is a perspective view showing the subpackage of FIG. 31 as viewed from below.

A second embodiment of the invention will now be described. First, a description will be given of the configuration of the composite layered chip package according to the present embodiment with reference to FIG. 30 to FIG. 32. FIG. 30 is a perspective view of the composite layered chip package according to the present embodiment. FIG. 31 is a perspective view of a subpackage of the present embodiment. FIG. 32 is a perspective view showing the subpackage of FIG. 31 as viewed from below.

In the present embodiment, the number of the plurality of layer portions 10 included in the main part 2M is four in every one of the plurality of subpackages 1S constituting the composite layered chip package 1. FIG. 30 shows an example where the composite layered chip package 1 includes three subpackages 1A, 1B, and 1C that are arranged in order from the top. Note that the subpackages 1A to 1C may be stacked in any order other than the example shown in FIG. 30. Hereinafter, the plurality of layer portions 10 in the subpackages 1A to 1C will be represented by the reference symbols L11, L12, L13, L14, L21, L22, L23, L24, L31, L32, L33, and L34 in order from the top when those layer portions are to be distinguished from each other.

In the present embodiment, as described below, the fourth-type electrodes 32D1 and 32D2 in each layer portion 10 are selectively electrically connected to one of the wires WC1 to WC4 and one of the wires WR1 to WR8, respectively, that the layer portion 10 uses.

In the example shown in FIG. 30, the wires W in the subpackage 1A are of the same shape as those in the subpackage 1B. The electrical connection relationship of the electrodes 32D1 and 32D2 with the wires W in the subpackage 1A is thus the same as that in the subpackage 1B. In the subpackages 1A and 1B, the wires WC1, WC2, and WR1 to WR4 are broadened in part.

In the subpackage 1A, the wire WC1 is in contact with the connection part 37D11 in each of the layer portions L11 and L12. The electrode 32D1 of each of the layer portions L11 and L12 is thereby electrically connected to the wire WC1. The wire WC2 is in contact with the connection part 37D12 in each of the layer portions L13 and L14. The electrode 32D1 of each of the layer portions L13 and L14 is thereby electrically connected to the wire WC2. The wire WR1 is in contact with the connection part 37D21 in the layer portion L11. The electrode 32D2 of the layer portion L11 is thereby electrically connected to the wire WR1. The wire WR2 is in contact with the connection part 37D22 in the layer portion L12. The electrode 32D2 of the layer portion L12 is thereby electrically connected to the wire WR2. The wire WR3 is in contact with the connection part 37D23 in the layer portion L13. The electrode 32D2 of the layer portion L13 is thereby electrically connected to the wire WR3. The wire WR4 is in contact with the connection part 37D24 in the layer portion L14. The electrode 32D2 of the layer portion L14 is thereby electrically connected to the wire WR4.

The foregoing description of the subpackage 1A applies to the subpackage 1B if the layer portions L11 to L14 are replaced with the layer portions L21 and L24.

In the subpackage 1C, the wires WC3, WC4, and WR5 to WR8 are broadened in part. The wire WC3 is in contact with the connection part 37D13 in each of the layer portions L31 and L32. The electrode 32D1 of each of the layer portions L31 and L32 is thereby electrically connected to the wire WC3. The wire WC4 is in contact with the connection part 37D14 in each of the layer portions L33 and L34. The electrode 32D1 of each of the layer portions L33 and L34 is thereby electrically connected to the wire WC4. The wire WR5 is in contact with the connection part 37D25 in the layer portion L31. The electrode 32D2 of the layer portion L31 is thereby electrically connected to the wire WR5. The wire WR6 is in contact with the connection part 37D26 in the layer portion L32. The electrode 32D2 of the layer portion L32 is thereby electrically connected to the wire WR6. The wire WR7 is in contact with the connection part 37D27 in the layer portion L33. The electrode 32D2 of the layer portion L33 is thereby electrically connected to the wire WR7. The wire WR8 is in contact with the connection part 37D28 in the layer portion L34. The electrode 32D2 of the layer portion L34 is thereby electrically connected to the wire WR8.

If each of the subpackages 1B and 1C includes no second-type layer portion 10B, the memory device shown in FIG. 6 can be constructed by using the subpackages 1B and 1C. Hereinafter, a composite layered chip package constructed by using the subpackages 1B and 1C that are assumed to include no second-type layer portion 10B will be referred to as an imaginary composite layered chip package. The semiconductor chips 30 of the eight layer portions L21, L22, L23, L24, L31, L32, L33, and L34 in the imaginary composite layered chip package function as the memory chips MC1 to MC8 shown in FIG. 6, respectively.

In the present embodiment, the composite layered chip package 1 having the same functions as those of the imaginary composite layered chip package is constructed under the following first to fifth conditions.

The first condition is that the number of the plurality of layer portions 10 included in the main part 2M is the same for all the plurality of subpackages 1S constituting the composite layered chip package 1, and the plurality of layer portions 10 in every one of the plurality of subpackages 1S include at least one first-type layer portion 10A. In the present embodiment, the number of the plurality of layer portions 10 included in the main part 2M is four, in particular.

The second condition is that, in each of at least two of the plurality of subpackages 1S constituting the composite layered chip package 1, the plurality of layer portions 10 further include at least one second-type layer portion 10B.

The third condition is that the number of the first-type layer portions 10A included in the composite layered chip package 1 is eight. The fourth condition is that the number of the plurality of subpackages 1S constituting the composite layered chip package 1 is no less than three and no more than eight. In the present embodiment, the number of the plurality of layer portions 10 included in the main part 2M is four. To satisfy the first to third conditions, the number of the plurality of subpackages 1S constituting the composite layered chip package 1 is therefore inevitably no less than three and no more than eight.

The fifth condition is that the eight first-type layer portions 10A included in the composite layered chip package 1 have the same functions as those of the eight layer portions L21, L22, L23, L24, L31, L32, L33, and L34 of the imaginary composite layered chip package, respectively.

FIG. 30 shows an example in which the plurality of layer portions 10 in each of the subpackages 1A and 1B include at least one second-type layer portion 10B. In the example, the subpackage 1A is used to compensate for the functions of the subpackage 1B that are lost due to the inclusion of the second-type layer portion(s) 10B. As in the first embodiment, such a subpackage will be referred to as an additional subpackage 1S.

The subpackages 1A and 1B have the wiring 3 of the same configuration. The subpackages 1A and 1B are complementary. More specifically, the subpackages 1A and 1B are in inverse relationship with each other in terms of the correspondence of the four layer portions with the first-type and second-type layer portions 10A and 10B. To put it more concretely, for example, if the subpackage 1B is such that the uppermost layer portion L21 is a second-type layer portion 10B while the layer portions L22 to L24 other than the layer portion L21 are first-type layer portions 10A, then the subpackage 1A is such that the uppermost layer portion L11 is a first-type layer portion 10A while the layer portions L12 to L14 other than the layer portion L11 are second-type layer portions 10B. In such an example, the layer portion L11 of the subpackage 1A substitutes for the layer portion L21 of the subpackage 1B.

If the subpackage 1B includes two or more second-type layer portions 10A, one or more additional subpackages 1S are used so that two or more first-type layer portions 10A included in the one or more additional subpackages 1S substitute for the two or more second-type layer portions 10B included in the subpackage 1B.

The foregoing description of the subpackages 1A and 1B also applies when the plurality of layer portions 10 in the subpackage 1C, not the subpackage 1B, include at least one second-type layer portion 10B. More specifically, in such a case, one or more additional subpackages 1S for compensating for the lost functions of the subpackage 1C are used instead of the subpackage 1A. The one or more additional subpackages 1S have the wiring 3 of the same configuration as that of the subpackage 1C. If the plurality of layer portions 10 in both of the subpackages 1B and 1C include at least one second-type layer portion 10B, a plurality of additional subpackages 1S are used for compensating for the lost functions of the respective subpackages 1B and 1C.

The step of fabricating the first layered substructure 115 of the present embodiment will now be described briefly. In the present embodiment, after the formation of the stack of two substructures 110 of the first embodiment shown in FIG. 21, the same steps as those in the first embodiment shown in FIG.

20 and FIG. 21 are repeated to form a stack of four substructures 110. The subsequent steps are the same as the steps of the first embodiment shown in FIG. 22 and the subsequent figures. In the present embodiment, the first layered substructure 115 that includes the four substructures 110 is used to produce a plurality of subpackages 1S each of which includes four layer portions 10.

In the present embodiment, the semiconductor chip 30 of the second-type layer portion 10B in an additional subpackage 1S is not limited to defective one and may be conforming one, as with the first embodiment. More specifically, in any layer portion 10 that includes a conforming semiconductor chip 30, electrical connection of the plurality of electrodes to the semiconductor chip 30 may be intentionally omitted to thereby fabricate an additional subpackage 1S that includes one or more second-type layer portions 10B. This makes it possible that, no matter which one(s) of the layer portions 10 in the subpackages 1B and 1C is/are the second-type layer portion(s) 10B, one or more additional subpackages 1S for compensating for the functions of the second-type layer portion(s) 10B can be prepared without fail.

The remainder of configuration, function and effects of the present embodiment are similar to those of the first embodiment.

Third Embodiment

Figure 33:
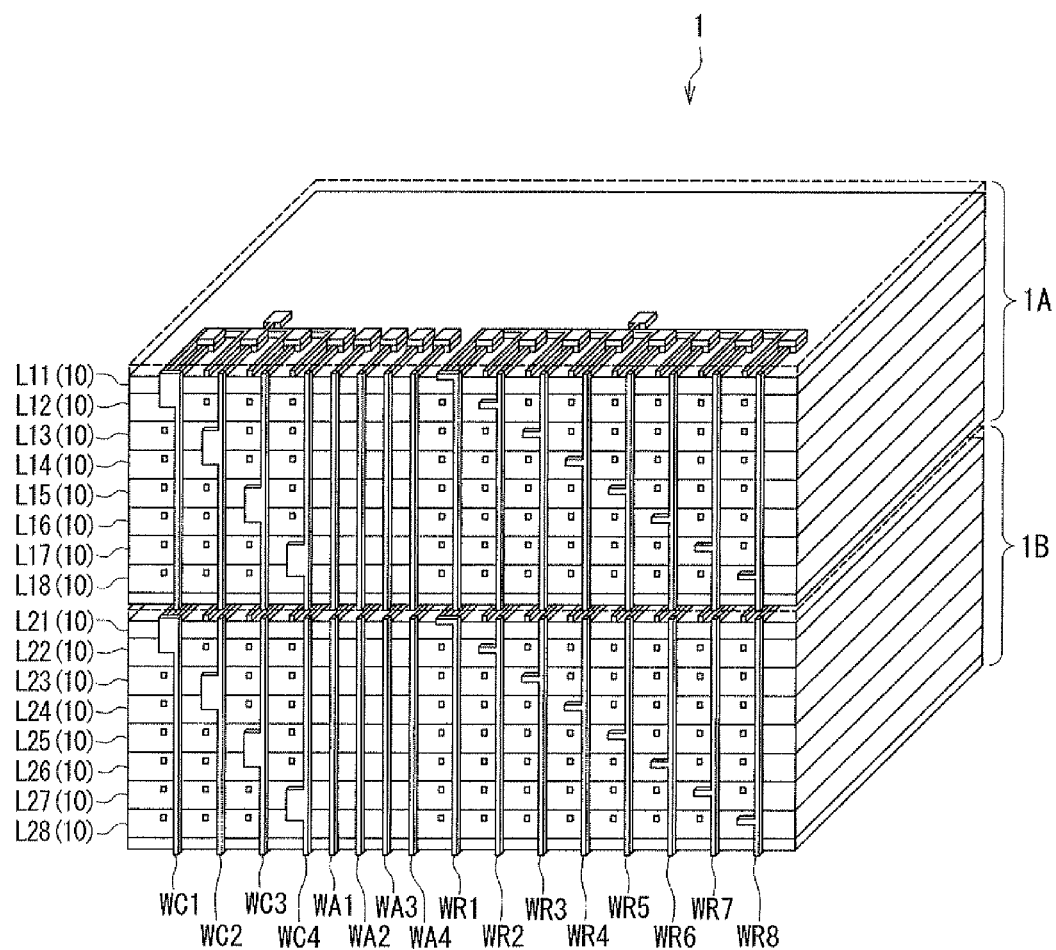
FIG. 33 is a perspective view of a composite layered chip package according to a third embodiment of the invention.
Figure 34:
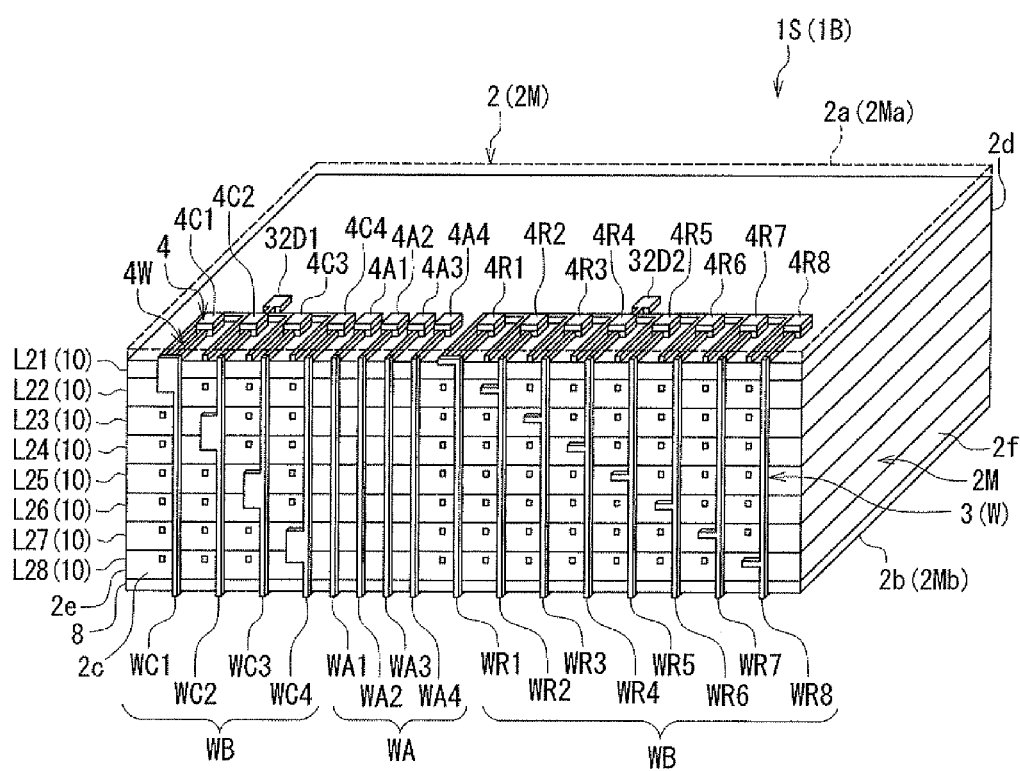
FIG. 34 is a perspective view of a subpackage of the third embodiment of the invention.
Figure 35:
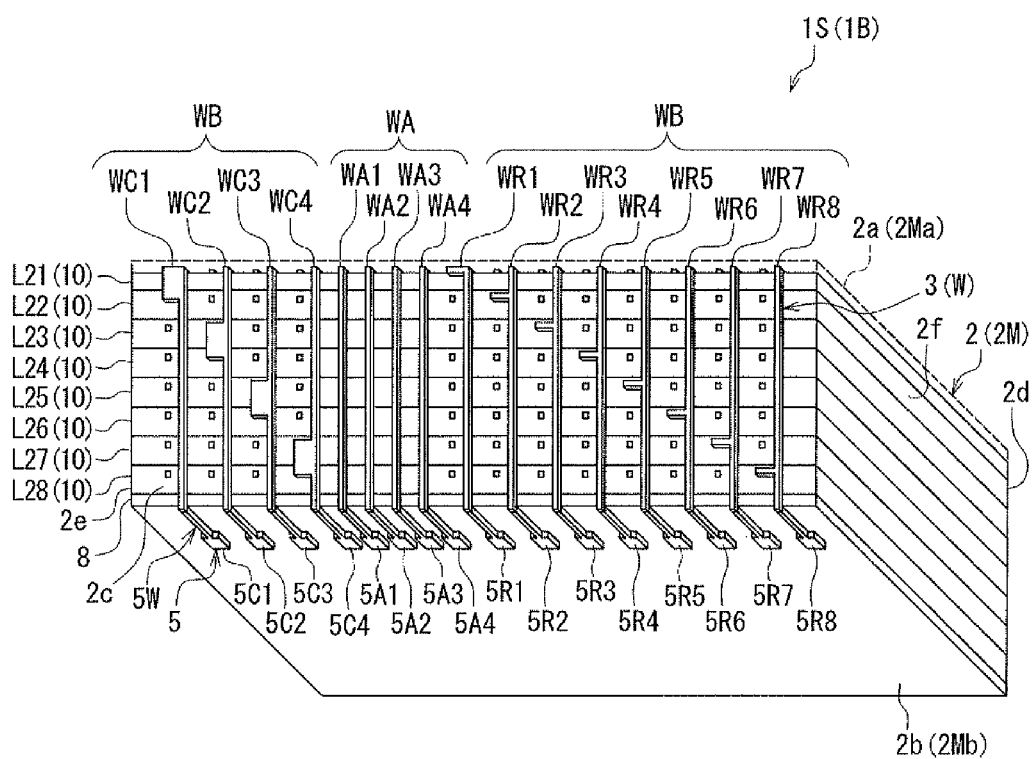
FIG. 35 is a perspective view showing the subpackage of FIG. 34 as viewed from below.

A third embodiment of the invention will now be described. First, a description will be given of the configuration of the composite layered chip package according to the present embodiment with reference to FIG. 33 to FIG. 35. FIG. 33 is a perspective view of the composite layered chip package according to the present embodiment. FIG. 34 is a perspective view of a subpackage of the present embodiment. FIG. 35 is a perspective view showing the subpackage of FIG. 34 as viewed from below.

In the present embodiment, the number of the plurality of layer portions 10 included in the main part 2M is eight in every one of the plurality of subpackages 1S constituting the composite layered chip package 1. FIG. 33 shows an example where the composite layered chip package 1 includes two subpackages 1A and 1B that are arranged in order from the top. Note that the subpackages 1A and 1B may be stacked in an order different from the example shown in FIG. 33. Hereinafter, the plurality of layer portions 10 in the subpackages 1A and 1B will be represented by the reference symbols L11, L12, L13, L14, L15, L16, L17, L18, L21, L22, L23, L24, L25, L26, L27, and L28 in order from the top when those layer portions are to be distinguished from each other.

In the present embodiment, as described below, the fourth-type electrodes 32D1 and 32D2 in each layer portion 10 are selectively electrically connected to one of the wires WC1 to WC4 and one of the wires WR1 to WR8, respectively, that the layer portion 10 uses.

In the example shown in FIG. 33, the wires W in the subpackage 1A are of the same shape as those in the subpackage 1B. The electrical connection relationship of the electrodes 32D1 and 32D2 with the wires W in the subpackage 1A is thus the same as that in the subpackage 1B. In the subpackages 1A and 1B, the wires WC1 to WC4, and WR1 to WR8 are broadened in part.

In the subpackage 1A, the wire WC1 is in contact with the connection part 37D11 in each of the layer portions L11 and L12. The electrode 32D1 of each of the layer portions L11 and L12 is thereby electrically connected to the wire WC1. The wire WC2 is in contact with the connection part 37D12 in each of the layer portions L13 and L14. The electrode 32D1 of each of the layer portions L13 and L14 is thereby electrically connected to the wire WC2. The wire WC3 is in contact with the connection part 37D13 in each of the layer portions L15 and L16. The electrode 32D1 of each of the layer portions L15 and L16 is thereby electrically connected to the wire WC3. The wire WC4 is in contact with the connection part 37D14 in each of the layer portions L17 and L18. The electrode 32D1 of each of the layer portions L17 and L18 is thereby electrically connected to the wire WC4.

The wire WR1 is in contact with the connection part 37D21 in the layer portion L11. The electrode 32D2 of the layer portion L11 is thereby electrically connected to the wire WR1. The wire WR2 is in contact with the connection part 37D22 in the layer portion L12. The electrode 32D2 of the layer portion L12 is thereby electrically connected to the wire WR2. The wire WR3 is in contact with the connection part 37D23 in the layer portion L13. The electrode 32D2 of the layer portion L13 is thereby electrically connected to the wire WR3. The wire WR4 is in contact with the connection part 37D24 in the layer portion L14. The electrode 32D2 of the layer portion L14 is thereby electrically connected to the wire WR4.

The wire WR5 is in contact with the connection part 37D25 in the layer portion L15. The electrode 32D2 of the layer portion L15 is thereby electrically connected to the wire WR5. The wire WR6 is in contact with the connection part 37D26 in the layer portion L16. The electrode 32D2 of the layer portion L16 is thereby electrically connected to the wire WR6. The wire WR7 is in contact with the connection part 37D27 in the layer portion L17. The electrode 32D2 of the layer portion L17 is thereby electrically connected to the wire WR7. The wire WR8 is in contact with the connection part 37D28 in the layer portion L18. The electrode 32D2 of the layer portion L18 is thereby electrically connected to the wire WR8.

The foregoing description of the subpackage 1A applies to the subpackage 1B if the layer portions L11 to L18 are replaced with the layer portions L21 and L28.

If the subpackage 1B includes no second-type layer portion 10B, the memory device shown in FIG. 6 can be constructed by using only the subpackage 1B. Hereinafter, a subpackage 1B that is assumed to include no second-type layer portion 10B will be referred to as an imaginary layered chip package. The semiconductor chips 30 of the eight layer portions L21 to L28 in the imaginary layered chip package function as the memory chips MC1 to MC8 shown in FIG. 6, respectively.

In the present embodiment, the composite layered chip package 1 having the same functions as those of the imaginary layered chip package is constructed under the following first to fifth conditions.

The first condition is that the number of the plurality of layer portions 10 included in the main part 2M is the same for all the plurality of subpackages 1S constituting the composite layered chip package 1, and the plurality of layer portions 10 in every one of the plurality of subpackages 1S include at least one first-type layer portion 10A. In the present embodiment, the number of the plurality of layer portions 10 included in the main part 2M is eight, in particular.

The second condition is that, in each of at least two of the plurality of subpackages 1S constituting the composite layered chip package 1, the plurality of layer portions 10 further include at least one second-type layer portion 10B.

The third condition is that the number of the first-type layer portions 10A included in the composite layered chip package 1 is eight. The fourth condition is that the number of the plurality of subpackages 1S constituting the composite layered chip package 1 is no less than two and no more than eight. In the present embodiment, the number of the plurality of layer portions 10 included in the main part 2M is eight. To satisfy the first to third conditions, the number of the plurality of subpackages 1S constituting the composite layered chip package 1 is therefore inevitably no less than two and no more than eight.

The fifth condition is that the eight first-type layer portions 10A included in the composite layered chip package 1 have the same functions as those of the eight layer portions L21 to L28 of the imaginary layered chip package, respectively.

FIG. 33 shows an example in which the composite layered chip package 1 is constructed by using the two subpackages 1A and 1B. In the example, the subpackage 1A is used to compensate for the functions of the subpackage 1B that are lost due to the inclusion of the second-type layer portion(s) 10B. As in the first embodiment, such a subpackage will be referred to as an additional subpackage 1S.

The subpackages 1A and 1B have the wiring 3 of the same configuration. The subpackages 1A and 1B are complementary. More specifically, the subpackages 1A and 1B are in inverse relationship with each other in terms of the correspondence of the eight layer portions with the first-type and second-type layer portions 10A and 10B. To put it more concretely, for example, if the subpackage 1B is such that the uppermost layer portion L21 is a second-type layer portion 10B while the layer portions L22 to L28 other than the layer portion L21 are first-type layer portions 10A, then the subpackage 1A is such that the uppermost layer portion L11 is a first-type layer portion 10A while the layer portions L12 to L18 other than the layer portion L11 are second-type layer portions 10B. In such an example, the layer portion L11 of the subpackage 1A substitutes for the layer portion L21 of the subpackage 1B.

If the subpackage 1B includes two or more second-type layer portions 10A, one or more additional subpackages 1S are used so that two or more first-type layer portions 10A included in the one or more additional subpackages 1S substitute for the two or more second-type layer portions 10B included in the subpackage 1B.

The step of fabricating the first layered substructure 115 of the present embodiment will now be described briefly. In the present embodiment, after the formation of the stack of two substructures 110 of the first embodiment shown in FIG. 21, the same steps as those in the first embodiment shown in FIG. 20 and FIG. 21 are repeated to form a stack of eight substructures 110. The subsequent steps are the same as the steps of the first embodiment shown in FIG. 22 and the subsequent figures. In the present embodiment, the first layered substructure 115 that includes the eight substructures 110 is used to produce a plurality of subpackages 1S each of which includes eight layer portions 10.

In the present embodiment, the semiconductor chip 30 of the second-type layer portion 10B in an additional subpackage 1S is not limited to defective one and may be conforming one, as with the first embodiment. More specifically, in any layer portion 10 that includes a conforming semiconductor chip 30, electrical connection of the plurality of electrodes to the semiconductor chip 30 may be intentionally omitted to thereby fabricate an additional subpackage 1S that includes one or more second-type layer portions 10B. This makes it possible that, no matter which one(s) of the layer portions 10 in the subpackage 1B is/are the second-type layer portion(s) 10B, one or more additional subpackages 1S for compensating for the functions of the second-type layer portion(s) 10B can be prepared without fail.

The remainder of configuration, function and effects of the present embodiment are similar to those of the first embodiment.

The present invention is not limited to the foregoing embodiments, and various modifications may be made thereto. For example, as far as the requirements of the appended claims are met, the number of the plurality of layer portions 10 included in the main part 2M is not limited to the examples illustrated in the foregoing embodiments, and can be arbitrarily chosen.

In the present invention, the wiring 3 may include a plurality of through electrodes that pass (penetrate) through all the plurality of layer portions, instead of the plurality of wires W. In this case, the connection parts of the plurality of electrodes are not exposed in the first side surface 2c of the main body 2 but are in contact with the through electrodes inside the main part 2M.

It is apparent that the present invention can be carried out in various forms and modifications in the light of the foregoing descriptions. Accordingly, within the scope of the following claims and equivalents thereof, the present invention can be carried out in forms other than the foregoing most preferred embodiments.

What is claimed is:

1. A composite layered chip package comprising a plurality of subpackages stacked on each other, every vertically adjacent two of the plurality of subpackages being electrically connected to each other, wherein:

each of the plurality of subpackages includes a main body and wiring;

the main body includes: a main part that has a top surface and a bottom surface, and includes a plurality of layer portions stacked on each other; a plurality of first terminals disposed on the top surface of the main part; and a plurality of second terminals disposed on the bottom surface of the main part;

the wiring is electrically connected to the plurality of first terminals and the plurality of second terminals;

in any vertically adjacent two of the plurality of subpackages, the plurality of second terminals of the main body of an upper one of the two subpackages are electrically connected to the plurality of first terminals of the main body of a lower one of the two subpackages;

the number of the plurality of layer portions included in the main part is the same for all the plurality of subpackages, and the plurality of layer portions in every one of the plurality of subpackages include at least one first-type layer portion;

in each of at least two of the plurality of subpackages, the plurality of layer portions further include at least one second-type layer portion;

each of the first-type layer portion and the second-type layer portion includes a semiconductor chip;

the semiconductor chip of the first-type layer portion is non-malfunctioning, and is electrically connected to the wiring;

the semiconductor chip of the second-type layer portion is not electrically connected to the wiring;

each of the first-type layer portion and the second-type layer portion further includes a plurality of electrodes that are electrically connected to the wiring;

the plurality of electrodes of the first-type layer portion are electrically connected to the semiconductor chip of the first-type layer portion; and the plurality of electrodes of the second-type layer portion are not electrically connected to the semiconductor chip of the second-type layer portion.

2. The composite layered chip package according to claim 1, wherein the semiconductor chip of the first-type layer portion and the semiconductor chip of the second-type layer portion each include a plurality of memory cells.

3. The composite layered chip package according to claim 1, wherein the number of the plurality of layer portions included in the main part is two in every one of the plurality of subpackages.

4. The composite layered chip package according to claim 3, wherein the number of the plurality of subpackages is no less than five and no more than eight, and the number of the at least one first-type layer portion included in the composite layered chip package is eight.

5. The composite layered chip package according to claim 1, wherein the number of the plurality of layer portions included in the main part is four in every one of the plurality of subpackages.

6. The composite layered chip package according to claim 5, wherein the number of the plurality of subpackages is no less than three and no more than eight, and the number of the at least one first-type layer portion included in the composite layered chip package is eight.

7. The composite layered chip package according to claim 1, wherein the number of the plurality of layer portions included in the main part is eight in every one of the plurality of subpackages.

8. The composite layered chip package according to claim 7, wherein the number of the plurality of subpackages is no less than two and no more than eight, and the number of the at least one first-type layer portion included in the composite layered chip package is eight.

* * * * *